United States Patent [19]

Mecklenbrauker et al.

[11] 3,978,323

[45] Aug. 31, 1976

[54] APPARATUS FOR ACHIEVING PREDETERMINED TRANSFER CHARACTERISTICS

[75] Inventors: Wolfgang Friedrich Georg Mecklenbrauker; Petrus Josephus van Gerwen; Wilfred André Maria Snijders; Theodoor Antonius Carel Maria Claasen; Hendrik Arie Van Essen, all of Eindhoven, Netherlands

[73] Assignee: U.S. Philips Corporation, New York, N.Y.

[22] Filed: Apr. 7, 1975

[21] Appl. No.: 565,390

[30] Foreign Application Priority Data

Apr. 18, 1974 Netherlands.................... 7405238

[52] U.S. Cl............................ 235/150.52; 235/156
[51] Int. Cl.².......................................... G06F 7/38
[58] Field of Search............. 235/150.52, 152, 156, 235/181; 333/18, 28 R, 70 T; 328/167

[56] References Cited
UNITED STATES PATENTS

| | | | |
|---|---|---|---|
| 3,624,562 | 11/1971 | Fujimura | 333/18 |
| 3,703,632 | 11/1972 | Shanks | 235/152 |
| 3,706,076 | 12/1972 | Schuster | 333/18 X |
| 3,736,414 | 5/1973 | McAuliffe | 235/181 |

*Primary Examiner*—Joseph F. Ruggiero
*Attorney, Agent, or Firm*—Frank R. Trifari; Daniel R. McGlynn

[57] ABSTRACT

An apparatus for producing a predetermined transfer characteristic of information-containing signals, comprising clock means for generating a clock pulse, input means for supplying digital representations of said information-containing signals; coefficient generator means for supplying a first train of pulses of digital multiplication coefficients; delay means; digital multiplier means; and a storage device including an alternator provided with a sign reversing device and a summation device.

27 Claims, 17 Drawing Figures

Fig.1

APPARATUS FOR ACHIEVING PREDETERMINED TRANSFER CHARACTERISTICS

The invention relates to an apparatus for achieving a predetermined transfer characteristic for processing information signals. The apparatus comprises a delay device and an input circuit to which information pulses derived from the information signals in accordance with a clock frequency are applied, a control generator which is connected to the delay device and which operates at a control frequency equal to an integral multiple of the clock frequency, and a digital multiplier. The digital multiplier is coupled to the delay device, which at each input pulse delivers a train of pulses in time sequence. The digital multiplier is also coupled to a multiplication program under the control of which the pulses of each of the pulse trains produced which are derived from the delay device are digitally multiplied sequentially in the multiplier by successive digital multiplication coefficients which represent a differential code characteristic of the transfer characteristic to be achieved. The output of the digital multiplier is connected to a storage device which sums the multiplication products obtained by digital multiplication of the pulses in the pulse trains, for example for use for purposes of equalising, filtering and wideband-phase-shifting both pulse signals and analog signals.

It was found that apparatus of the aforementioned type permitted considerable technical improvements as compared to the conventional apparatuses for achieving a predetermined transfer characteristic. In particular, in our copending U.S. Patent Application Serial No. 474,810, it was proposed to construct the digital multiplier as a pulse switch having a plurality of pulse switch positions and to design the multiplication program as a pulse switch setting program for setting the pulse switch to a given pulse switch position of the various pulse switch positions, in each of which pulse switch positions a digital multiplication is performed by a multiplication coefficient which exclusively forms part of the discrete set of numbers $2^m$, where $m = 0, 1, 2 \ldots$ and possibly the number 0, the resulting multiplication products being summed in the storage device with the use of an integrator. As was extensively set forth in the aforementioned patent application, the particularly advantageous shape of the desired transfer characteristic with the use of the comparatively restricted number of discrete multiplication coefficient according to the exponential number series $2^m$ and possibly the number 0 was found to be associated with a remarkable simplification of the digital multiplier and with optimum utilisation of the available internal processing time, while also the number of possible applications was increased.

When testing the apparatus according to the prior patent application it was found that in certain applications, especially when shifting the transfer characteristic to higher frequency ranges, inter alia for implementing filters having a pass-band of comparatively high center frequency while retaining the high quality of the shape of the transfer characteristics, the time interval between the pulses of the pulse trains generated in the delay device had to be reduced and hence the frequency of the pulse train had to be increased, which results in a more complex structure of the apparatus and in a reduction of the available internal processing time.

The object of the present invention is to provide an apparatus of the aforementioned type in which, without appreciable modification of the simple structure and while avoiding any reduction of the available internal processing time, the high quality requirements with regard to the transfer characteristic are satisfied while furthermore the possibilities of use are further extended.

The apparatus according to the invention is characterized in that an alternator provided with a sign reversing device and a summation device is connected in the circuit which includes the storage device, which alternator forms the sums, which alternate in sign, of the multiplication products applies via the multiplier which lie within given time periods and of the multiplication products of the multiplier applied in the preceding given time periods according to a predetermined time pattern, which sums are derived as outputs from the apparatus including the alternator.

In a particularly advantageous embodiment the input of the sign reversing device is connected to the output of the summation device which is fed by the sign reversing device via a re-circulating line and also by multiplication products of the multiplier which lie within given time periods.

Embodiments of the invention will now be described, by way of example, with reference to the accompanying diagrammatic drawings, in which.

Figure 1:
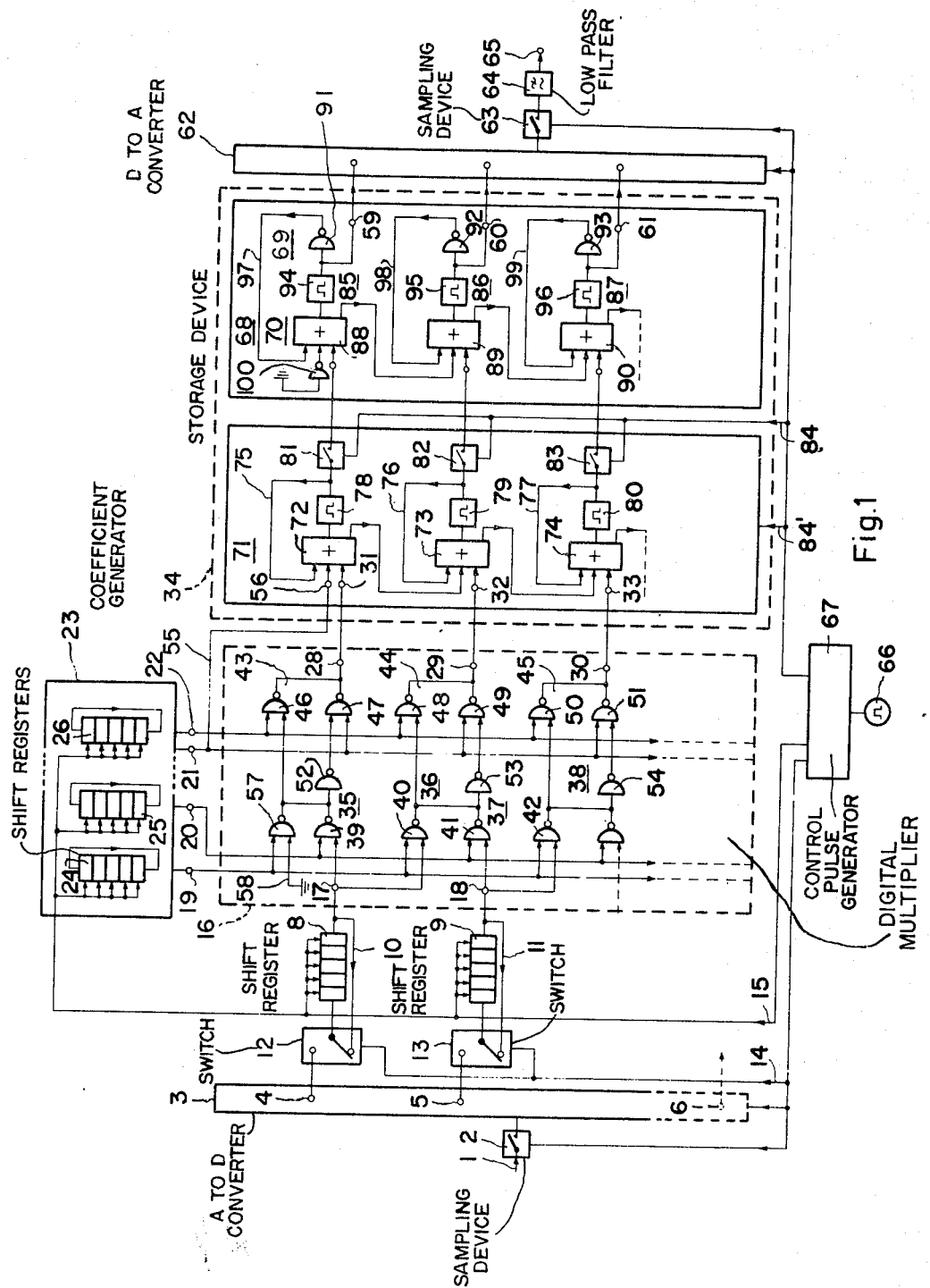
FIG. 1 is a schematic circuit diagram of an apparatus according to the invention designed as a band-pass filter for analog signals, FIG. 2 showing illustrative time and frequency diagrams.

FIG. 1 shows there is shown an apparatus arranged for use as a band-pass filter for analog signals which enable the filtering process to be digitally performed; the incoming analog signals are first converted to digital form. For this purpose in the embodiment shown the analog signals received from a line 1 are sampled in a sampling device 2 by means of sampling pulses at clock frequency and then applied to an analog-to-digital converter 3 which comprises a parallel-output pulse group encoder, the output terminals of which are designated by 4, 5, 6, . . . respectively. The clock frequency F is equal to 1/T, where T is a clock period.

Each time the sampling device 2 performs a sampling operation at a clock instant, the output terminals 4, 5, 6, . . . of the pulse group encoder 3 deliver a pulse group in parallel form which is characterized by binary pulses and which in a binary number system indicates the quantised amplitude value of the sampling. More particularly the pulses at the output terminal 4 characterize the amplitude value $2^0$, those at the output terminal 5 the amplitude value $2^1$, those at the output terminal 6 the amplitude value $2^2$, and so on.

Thus when at an arbitrary clock instant given by an arbitrary integral multiple of the clock period T a pulse group $U_\gamma$ occurs, and if binary pulses which simultaneously appear at the output terminals 4, 5, 6, . . . are denoted by $u_{\gamma,0}, u_{\gamma,1}, \ldots u_{\gamma,i}, \ldots, u_{\gamma,(k-1)}$, where $k$ is the number of output terminals 4, 5, 6, . . . of the pulse group encoder 3, the pulse group represents the numerical value:

$$\sum_{i=0}^{i=k-1} 2^i u_{\gamma i}$$

In order to perform the digital filtering process the output terminals 4, 5, 6, . . . of the pulse group encoder are connected to delay devices in the form of shift registers 8, 9, . . . each of which comprises a plurality of shift register elements, an input circuit and an output circuit, which shift registers 8, 9, . . . are constructed as circulating shift registers by means of recirculating circuits 10, 11, . . . respectively each connected between an input circuit and an output circuit. In the Figure only the first two shift registers 8 and 9 are shown in detail, because the remaining shift registers are equal thereto.

Each of the input circuits of the shift registers 8, 9 comprises a switch 12, 13 respectively which is normally connected to the recirculating circuit 10, 11, respectively and via a line 14 is connected, by means of a switching pulse from a switching pulse generator, to the output terminals 4, 5, 6, . . . respectively of the pulse group encoder 3, while the contents of all the shift registers 8, 9, . . . are shifted by means of a common control generator in the form of a shift pulse generator via a line 15 at a shift frequency equal to an integral multiple $n$ of the clock frequency $F = 1/T$.

As will be set out more fully hereinafter, in order to carry out the digital filtering process care has been taken to ensure that each of the pulses of a pulse code group which at the clock instants are inserted into the first shift register element of the relevant shift register 8, 9, . . . causes a train of output pulses to be produced at the shift register output circuit in time sequence, and in the embodiment shown this is achieved in that, with the shift frequency of $nF$ Hz used, the number of shift register elements of each of the shift registers 8, 9 is made equal to $n-1$.

In order to carry out the digital filtering process the apparatus shown includes a digital multiplier 16 having a parallel input comprising $k$ input terminals 17, 18, . . . each of which is connected to an output circuit of one of the k shift registers 8, 9, . . . and a parallel input comprising $p$ input terminals each of which is connected to one of output terminals 19, 20, 21, 22 . . . of a parallel-output multiplication program 23. For example, in the embodiment shown the multiplication program 23 comprises a plurality of circulating shift registers 24, 25, 26 each of which comprises $n$ shift register elements, which shift registers 24, 25, 26 are controlled, similarly to the shift registers 8, 9, via line 15 by shift frequency $nF$.

In the digital multiplier 16 the pulses of each of the pulse trains formed, which pulses are applied via the shift registers 8, 9 to the input terminals 17, 18, are successively multiplied digitally under the control of the multiplication program 23 by digital multiplication coefficients, the resulting multiplication products being applied for further processing via output terminals 28, 29, 30, . . . of the parallel-output digital multiplier 16 to input terminals 31, 32, 33, . . . of a storage device 34, which terminals correspond to numerical values $2^0$, $2^1$, $2^2$, . . . respectively.

In the embodiment shown the digital multiplier 16 is of the type described extensively in copending U.S. Patent Application Serial No. 474,810. In particular, the digital multiplier 16 is constructed as a pulse switch having a plurality of pulse switch positions while the multiplication program 23 is designed as a pulse switch setting program for setting the pulse switch 16 to a particular one of the various pulse switch positions, in each of which pulse switch positions a digital multiplication is performed by a multiplication coefficient which exclusively forms part of the discrete set of numbers $2^m$, where $m = 0, 1, 2, . . .$, and possibly the number 0 and in a differential code characterizes the transfer characteristic to be achieved.

In a particularly advantageous embodiment the pulse switch comprises parallel-connected pulse switch channels 35, 36; 37, 38 connected between the input terminals 17, 18, . . . and the output terminals 28, 29, 30, . . . of the digital multiplier 16 which is provided with a pulse switch setting circuit which is connected to the output terminals of the pulse switch setting program 23 and comprises NOT-AND gates 39, 40 and 41, 42, respectively. The pulse switch channels 35, 36, 37, 38 further include sign stages 43, 44, 45 each of which comprises two parallel-connected branches, each branch including NOT-AND gates 46, 47; 48, 49; 50, 51 which are controlled by logically inverted sign pulses from output terminals 21, 22 of the setting program 23, and NOT-AND gates 52, 53, 54 which serve as inverters and are connected in cascade with the NOT-AND gates 47, 49, 51, respectively.

In order to obtain from the logically inverted pulse group at the outputs of sign stages 43, 44, 45 the pulse group of opposite sign in a binary number system, sign pulses are applied from the output terminal 21 of the pulse switch setting program 23 via a line 55 to an input terminal 56 of the storage device 34, while furthermore providing equality of the digital circuits situated between input terminals 17, 18 and output terminals 28, 29, 30 of the pulse switch 16. The sign stage 43 of the first pulse switch channel 35 includes another NOT-AND gate 57 which further has no significance, because a fixed potential corresponding to "0" pulses is applied to this NOT-AND gate 57 via a line 58.

Depending on which of the pulse groups 00, 01, 10 of the setting code used appears at the output terminals 19, 20 of the pulse switch setting program 23 the pulse switch channels 35, 36, 37, 38 are set to the desired discrete multiplication coefficients by the control of the NOT-AND gates 39, 40; 41, 42, which coefficients in the embodiment under consideration are 0, $2^0$ and $2^1$. More particularly, at the appearance of the pulse group 00 of the setting code none of the pulse switch channels 35, 36, 37, 38 will be rendered operative. At the appearance of the pulse group 01 the pulse switch channels 35, 37 will be rendered operative and at the appearance of the pulse group 10 the pulse switch channels 36, 38 will be rendered operative, corresponding to multiplication coefficients 0, $2^0$ and $2^1$ respectively. Simultaneously in the sign stages 43, 44, 45 of the pulse switch channels 35, 36, 37, 38 sign setting takes place by the control of the NOT-AND gates 46, 47, 48, 49, 50, 51 by means of mutually inverted sign pulses from the output terminals 21, 22 of the pulse switch setting program 23, so that the pulses of the pulse switch channels 35, 36, 37, 38 are passed either through one branch or through the other of the sign stages 43, 44, 45.

Each time a pulse group appears at the input terminals 17, 18 of the digital multiplier 16, this group is digitally multiplied according to sign and magnitude by the multiplication coefficient which has been set at the particular instant, which coefficients together in a differential code are characteristic of the transfer characteristic to be achieved, the resulting multiplication products being digitally summed in the apparatus as described in copending U.S. Pat. Application Ser. No. 474,810, in the storage device 34 having an integrating operation. Thus, as is set forth in detail in the above-mentioned U.S. Pat. application, at output terminals 59, 60, 61 of the storage device 34 pulse groups appear which, after digital-to-analog conversion in a digital-to-analog converter 62 controlled by control pulses and in a succeeding sampling device 63 controlled by sampling pulses, via a simple low-pass filter 64 serving to suppress signals from undesirable pass ranges produce the output signal from the apparatus described at an output terminal 65.

The control pulses for the digital-to-analog converter 62, the sampling pulses for the sampling device 63 and all the remaining control pulses for the apparatus described are derived from a central control pulse generator 67 which is connected to a pulse generator 66, in particular the sampling pulses for the sampling device 2 and the control pulses for the analog-to-digital converter 3, while this central control pulse device 67 also includes the common shift pulse generator for the shift registers 8, 9 and for the pulse switch setting program 23 and the switch pulse generator for the switches 12 and 13.

To illustrate the operation of the apparatus described it will be assumed that at an arbitrary clock instant T the pulse group $U_\gamma$ appears at the parallel output 4, 5, 6 of the analog-to-digital converter 3, and in particular at this instant T the pulses of this pulse group $U_\gamma$ are inserted through the switches 12, 13 into the first shift register element of the shift registers 8, 9, . . . respectively, while the pulses of the preceding pulse groups $U_{\gamma-1}, U_{\gamma-2}, \ldots, U_{\gamma-(n-2)}$ are shifted to the next shift register element of the shift registers 8 and 9 respectively and the pulse group $U_{\gamma-(n-1)}$ are applied to the digital multiplier 16 for digital multiplication according to sign and magnitude by the instantaneous multiplication coefficient $C_n$ set. Thus a pulse group $C_n U_{\gamma-(n-1)}$ appears at the parallel output 28, 29, 30 of the digital multiplier 16 and is applied to the storage device 34.

From the next subsequent shifting instant $\gamma T + T/n$ to the next clock instant $(\gamma + 1)T$ the last shift register element of each shift register 8, 9 is connected to the first shift register element thereof via the switches 12, 13 and the recirculating circuits 10, 11 respectively, and in the successive shift periods the pulses of the pulse groups are cyclically shifted, the pulses in the last shift register element being shifted to the first shift register element, while simultaneously the pulse groups formed by these pulses are multiplied in the digital multiplier 16 by the multiplication coefficient set by the pulse switch setting program 23. For example, at the shift instant $\gamma T + T/n$ the pulses of the pulse group $U_{\gamma-(n-2)}$ are shifted to the first shift register element of the shift registers 8, 9, and at an arbitrary shift instant $\gamma T \pm (n-q)T/n$ the pulse group $U_{\gamma-(q-1)}$ is shifted to this first shift register element, the pulse groups being multiplied in the digital multiplier 16 by the multiplication coefficients $C_{n-1}$ and $C_q$ respectively. After $n$ shift instants the next clock instant $(\gamma + 1)T$ is reached and the pulses of the pulse group $U_{\gamma+1}$, which group appears at the parallel output of the analog-to-digital converter 3 at this instant, is applied via the switches 12 and 13 to the first shift register element of the shift registers 8 and 9 respectively, after which the described cycle will repeat.

During a clock period, owing to the multiplication products $C_n U_{\gamma-(n-1)}, C_{n-1} U_{\gamma-(n-2)}, \ldots, C_1 U_\gamma$ produced the output signal from the integrating effect storage device 34 will experience a change by a contribution equal to the sum of the said multiplication products:

$$\sum_{q=n}^{q=1} C_q U_{\gamma-(q-1)}$$

integration of all these contributions, taken over the preceding clock periods, providing the output signal of the storage device 34. More particularly, in this manner at the end of, for example, a clock interval pT there will appear at the output terminals 59, 60, 61 of the storage device 34 a pulse group which is shown in sign and magnitude by the formula:

$$\sum_{\gamma=1}^{\gamma=p} \sum_{q=n}^{q=1} C_q U_{\gamma-(q-1)}$$

At the end of each clock period, in the digital-to-analog converter 62 digital-to-analog conversion of the pulse groups at the output terminals 59, 60, 61 of the storage device 34 takes place, and after sampling in the sampling device 63 and passing through the low-pass filter 64 the output signal of the device is obtained at the output terminal 65, and, as mentioned hereinbefore, this signal forms the input signal filtered according to the transfer function $H(\omega)$.

To learn the transfer function $H(\omega)$ one may start from what is generally referred to as the pulse response $I(t)$ which is determined by the output signal of the apparatus described when at an arbitrary clock instant $\gamma T$ a single pulse of unity value is applied to the analog-to-digital converter 3 which then will produce a single pulse group $U_\gamma$ at its output terminals. As explained hereinbefore, owing to this pulse group there will be produced at the output terminals of the circulating shift registers 8 and 9 in time sequence a series of successive pulse groups $U_\gamma$ which are successively multiplied by the multiplication coefficients $C_1, C_2, \ldots, C_q, \ldots, C_n$ in the digital multiplier 16 so that at the end of the clock intervals following the clock instants $\gamma T, (\gamma+1)T, \ldots, (\gamma+q-1)T, \ldots (\gamma+n-1)T$ the output signal of the storage device 34 and hence that of the digital-to-analog converter 62 will be changed by a contribution $C_1 U_\gamma, C_2 U_\gamma, \ldots, C_q U_\gamma, \ldots, C_n U_\gamma$. Standardization of the pulse group $U_\gamma$ to the unity value provides the pulse response $I(t)$ of the apparatus.

Figure 2A:
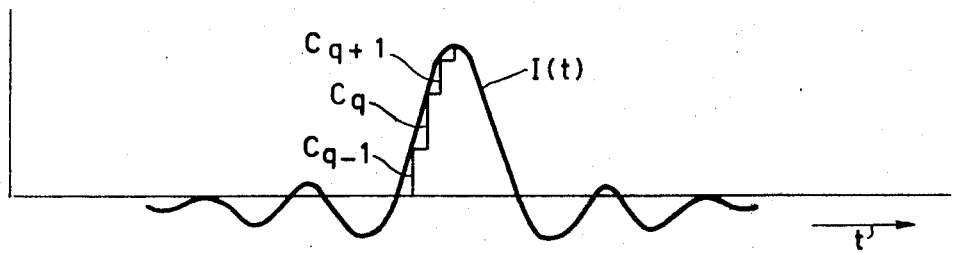

By way of illustration FIG. 2a shows in a time diagram the pulse response $I(t)$ which in accordance with the preceding has been built up differentially in that at the end of each of the clock intervals $(\gamma+1)T, \ldots, (\gamma+q-1)T, \ldots, (\gamma+n-1)T$ a contribution or difference is added to the value attained at the end of the respective preceding clock interval $\gamma T, \ldots, (\gamma+q-2)T, \ldots, (\gamma+n-2)T$ of the pulse response and if the pulse group $U_\gamma$ is standardized to unity value this contribution or difference is exactly equal to the multiplication coefficient $C_1, C_2, \ldots, C_q, \ldots, C_n$ associated with the relevant clock interval. Thus at the end of a clock interval the pulse response will have a value equal to the sum of all the preceding multiplication coefficients so that, for example at the end of the clock interval pT the value of the pulse response is:

$$I(t_p) = \sum_{q=1}^{q=p} C_q$$

To obtain the transfer function $H(\omega)$ from the pulse response $I(t)$ we start from an arbitrary component of angular frequency $\omega$ and amplitude E in the frequency spectrum of the signal applied to the input of the apparatus, which component may be written in complex representation as: $Ee^{j\omega T}$.

At the output of the digital-to-analog converter 62 the relevant spectrum component appears in the successive output pulses at time intervals T, 2T, 3T, . . ., qT, . . ., nT shifted by an amplitude equal to the initial amplitude multiplied by the numerical values of the pulses response at the said instants, i.e. an arbitrary component $Ee^{j\omega T}$ in the frequency spectrum of the input signal will produce at the output of the apparatus an output signal:

$$E \cdot \sum_{p=1}^{p=n} \sum_{q=1}^{q=p} C_q e^{j\omega(t-pT)}$$

so that we find for the transfer characteristic H( ):

$$H(\omega) = \sum_{p=1}^{p=n} \sum_{q=1}^{q=p} C_q e^{-j\omega pT}.$$

Figure 2B:
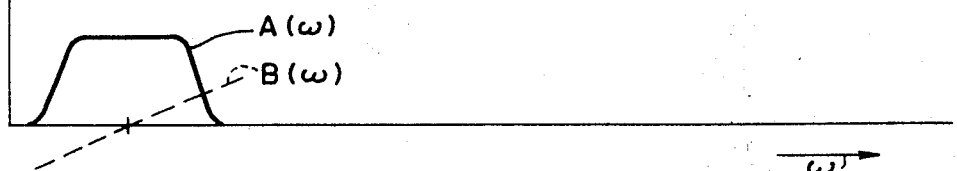

Hence in actual fact the transfer characteristic $H(\omega)$ is nothing but the transformation of the pulse response $I(t)$ to the frequency domain, while conversely the pulse response $I(t)$ is nothing but the transformation of the transfer characteristic $H(\omega)$ to the time domain. For example, in FIG. 2b a curve $A(\omega)$ shows the amplitude-frequency characteristic associated with the pulse response $I(t)$ of FIG. 2a in a frequency diagram and the curve $B(\omega)$ shows the phase-frequency characteristic which in this event is linear.

Thus, if a given transfer characteristic $H(\omega)$ is to be achieved which is characterized by associated amplitude-frequency characteristic $A(\omega)$ and its associated phase-frequency characteristic $B(\omega)$, the pulse response $I(t)$ can be computed therefrom by means of Fourier analysis, and from this pulse response the multiplication coefficients $C_q$ may be computed, so that the apparatus described is completely defined.

In practice excellent results have been obtained with the apparatus as described in copending U.S. Pat. Application Ser. No. 474,810 in which the pulse response $I(t)$ is differentially built up by means of contributions of differences according to the discrete set $2^m$, where $m = 0, 1, 2, \ldots$, and the value 0. More particularly, it was found that good shaping of the desired transfer characteristic with the use of the restricted number of multiplication coefficients according to the discrete set was accompanied with remarkable simplicity of the digital apparatus and with optimum available internal processing time. Thus, for example, FIG. 2a and FIG. 2b respectively show the pulse response $I(t)$ and the transfer function $H(\omega)$ for a filter having a pass band between 0.3 and 3.4 kHz and a center frequency of 1.85 kHz at a clock frequency $f = 1/T$ of 40 kHz.

Extensive experiments with the afore-described apparatus according to copending U.S. Pat. application Ser. No. 474,810 have shown that especially when the transfer characteristics are shifted to higher frequency ranges in order to obtain filters having pass bands of higher center frequencies the high quality requirements with regard to the shaping of the filter characteristics are no longer satisfied, and further investigation has shown that this was due to the fact that owing to the described differential method of building up the shape of the pulse response of the filter concerned was approximated with reduced exactness, as will now be explained with reference to the diagrams of FIGS. 2c and 2d.

Figure 2C:
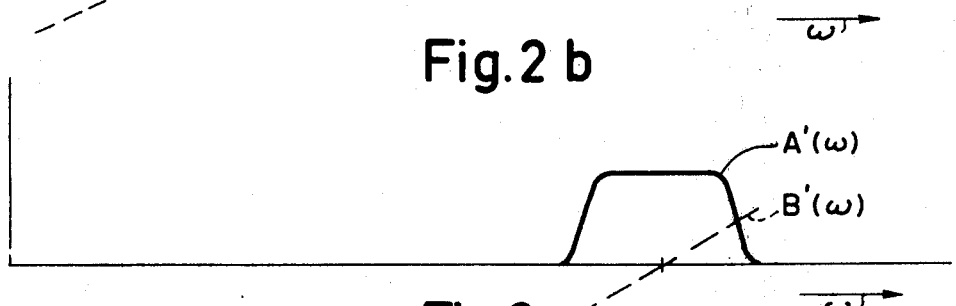
Figure 2D:
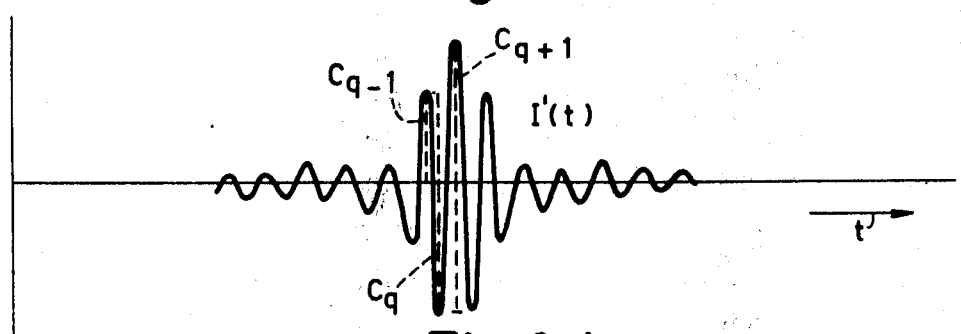

FIG. 2c shows the transfer characteristic of a filter having an amplitude-frequency characteristic shown by $A'(\omega)$ and a phase-frequency characteristic shown by $B'(\omega)$, which filter has a pass band of 3.1 kHz and a center frequency equal to 18.15 kHz at a clock frequency of 40 kHz. FIG. 2d shows the associated pulse response characteristic $I'(t)$, from which it will be seen that the values of the differences or contributions have greatly increased as compared with those in the pulse response $I(t)$ of FIG. 2a and that these differences even are greater than the ensuing values of the pulse response $I'(t)$ itself, which is the cause of the reduction in exactness of the approximation to the transfer characteristic $H'(\omega)$. If with the apparatus the quality requirements with regard to the filter characteristic are still to be satisfied the clock frequency must considerably be increased, for example by a factor of 10. However this increase of the clock frequency results in increased complexity of the structure of the apparatus and in a corresponding reduction of the available internal processing time.

According to the invention the use of a completely new concept enables the quality requirements with regard to the transfer characteristic to be satisfied without reducing the available internal processing time while retaining a simple structure in that an alternator 68 comprising a sign reversing device 69 and a summation device 70 is connected in the circuit which includes the storage device 34, which alternator 68 according to a prescribed time pattern forms the sum of the multiplication products which are supplied by the multiplier 16 within given time periods and of the multiplication products supplied by the multiplier 16 in the preceding time periods, which sum alternates in sign and is derived as the output signal from the apparatus including the alternator 68.

In the embodiment shown, the alternator 68 is preceded in the storage device by an accumulator 71 which digitally adds together the multiplication products of the multiplier 16 which are produced within a time period of a clock interval T, whereupon in the alternator 68 the digital sum thus formed in each clock interval and the digital sum of the preceding clock intervals are added to form a sum of alternating sign in accordance with the clock period as prescribed time pattern. Both the accumulator 71 and the alternator 68 are of the parallel type and each have a parallel input and a parallel output, the parallel output of the alternator 68 being connected to the input of the digital-to-analog converter 62.

To find the digital sum of the multiplication products of the multiplier 16 in each clock interval the accumulator 71 is provided with a plurality of parallel digital summing stages 72, 73, 74 which each have a feedback loop 75, 76, 77 respectively which comprises a bistable trigger circuit 78, 79, 80 respectively as a delay element, which loop is connected between an output circuit of the parallel output and the input of the respective digital summation stage 72, 73, 74 while an output of each digital summation stage 72, 73, 74 is connected to an input of the respective next summation stage 73, 74, . . . for the carry pulses produced in the digital summation. An input terminal 56 of the first summation stage 72 is connected via the aforementioned line 55 to the sign terminal 21 of the pulse switch setting program 23.

When during a clock period the multiplication products formed in this time period have been summed in the accumulator 71, the resulting digital sum is supplied to the alternator 68 via an electronic switch 81, 82, 83 respectively and also the accumulator 71 is reset to the inoperative condition by means of reset pulses applied to all the bistable trigger circuits 78, 79, 80, . . ., after which the described cycle will repeat in the next clock period. The control pulses for the electronic switches 81, 82, 83 and the reset pulses for the bistable trigger circuits 78, 79, 80 are derived from lines 84 and 84' respectively which are connected to the central control pulse generator 67.

To form the alternating sums, at the frequency of the clock period, of the digital sum formed in the accumulator 71 in each clock interval and of the digital sums formed in the preceding clock intervals, the alternator 68 of the parallel type comprises a summation device 70 and a sign reversal device 69, which respectively comprise summation stages 88, 89, 90 included in parallel channels 85. 86, 87 respectively, and inverter stages 91, 92, 93 in the form of NOT-AND gates for logically inverting the applied pulse groups, an output of each summation stage 88, 89, 90 being connected to an input of an inverter stage 91, 92, 93 via a bistable trigger 94, 95, 96, respectively, while an input of each summation stage 88, 89, 90 is connected via a feedback loop 97, 98, 99 respectively to the output of the relevant inverter stage and also to an output terminal of the preceding accumulator 71. For sign reversal in a binary number system the summation stage 88 also has "1" pulses applied to it from a NOT-AND gate 100 connected to a fixed potential, while an input of each of the summation stages 89 and 90 is connected to an output of the preceding summation stage 88 and 89 respectively for the carry pulses produced in the digital summation operation. From the outputs of the bistable triggers 94, 95, 96 the output signal of the storage device 34 including the alternator 68 is derived and for this purpose the bistable triggers 94, 95, 96 are connected through lines having output terminals 59, 60, 61 to the digital-to-analog converter 62 for further processing.

In the storage device 34 including the alternator 68 the multiplication products of the digital multiplier 16 which are situated in each clock period T are first digitally added together in the accumulator 71 and then summed in the alternator 68 with alternating sign in accordance with the clock period. In particular, in the alternator 68 the digital output signal of the summation device 70 is delayed in the bistable trigger circuit 94, 95, 96 by a clock period and has its sign reversed in the sign reversal device 69 and then is fed back via feedback loops 97, 98, 99 respectively to the summation device 70 for summation with the digital sum of multiplication products formed in the next clock period and supplied by the accumulator 71, whereupon the resulting output signal of the summation device 70 is again delayed by one clock period and again has its sign reversed and is again fed back via the feedback loops 97, 98, 99 to the input of the summation device 70. The cycle described repeats each time and thus in the alternator 68 the sum of alternating sign is formed of the output signals of the accumulator which occur in accordance with the clock period, which sum of alternating sign is derived from the output terminals 59, 60, 61 and is applied to the digital-to-analog converter 62 for digital-to-analog conversion. Through the sampling device 63 and the lowpass filter 64 the output signal of the apparatus is taken from the output terminal 65, and according to the foregoing this signal forms the input signal filtered according to the transfer function $H'(\omega)$ of FIG. 2c when the successive multiplication coefficients are suitably set in the digital multiplier 16.

Figure 2E:
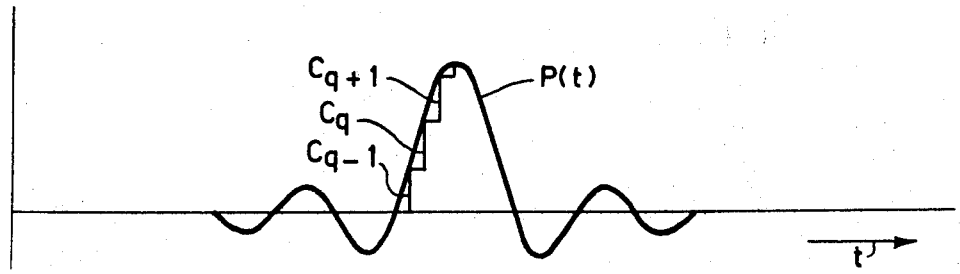
Figure 2:
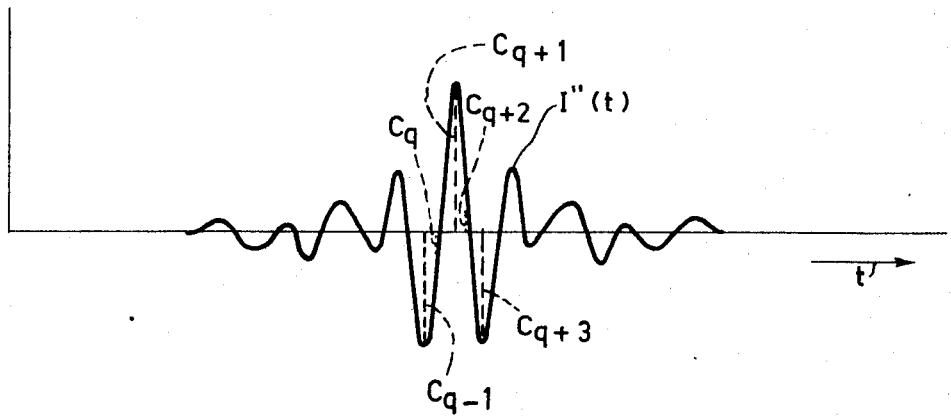
Figure 2:
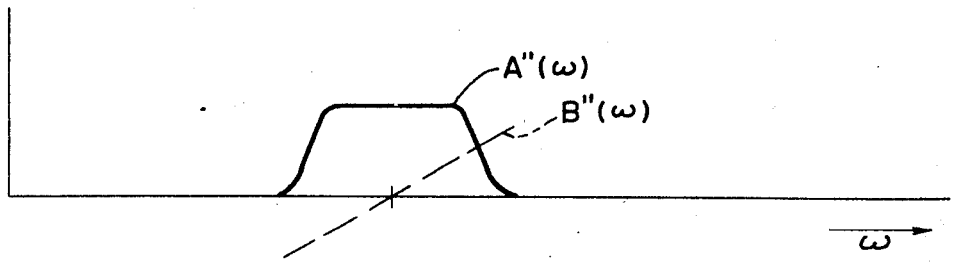
Figure 2:
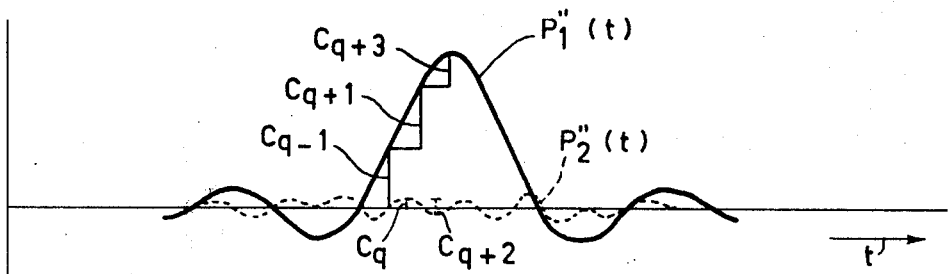

The concept of the apparatus according to the invention is completely different from that of the known apparatus of the aforementioned type, for while in the known apparatus a desired transfer characteristic is obtained by starting directly from the pulse response the apparatus according to the invention starts from the pulse response $P(t)$ of the corresponding low-pass filter which can be regarded as the envelope of the pulse response. Thus in the apparatus according to the invention the transfer characteristic $H'(\omega)$ of FIG. 2c having the amplitude-frequency characteristic $A'(\omega)$ and the phase-frequency characteristic $B'(\omega)$ is not obtained by starting from the pulse response $I'(t)$ of FIG. 2d but by starting from the envelope of the pulse response which is indicated in FIG. 2e by the curve $P(t)$ which owing to its shape is highly suitable to be built up differentially, in contradistinction to the shape of the pulse response $I'(t)$ of FIG. 2d. It was found that even at the theoretically minimum clock frequency the envelope $P(t)$ is reproduced with a high quality, as is illustrated in FIG. 2e.

In the alternator the envelope $P(t)$ of FIG. 2e is converted into the pulse response $I'(t)$ of FIG. 2d, and in particular in the alternator the pulse response $I'(t)$ is obtained by alternating summation of the standardized multiplication products and the standardized multiplication products of the preceding clock period, which standardized multiplication products, as has been set out hereinbefore, are exactly equal in magnitude to the multiplication coefficients $C_q$. Thus, at the end of the successive clock intervals the alternating sums of the preceding standardized multiplication products are produced at the output terminals 59, 60, 61 of the alternator 68 as the instantaneous values of the pulse response $I'(t)$. For example, at the end of the clock interval pT the pulse response is given by the formula:

$$I'(t_p) = \sum_{q=1}^{q=p} C_q(-1)^p$$

or, expressed in the envelope $P(t)$:
$I'(t_p) = (-1)^p P(t_p).$
which expresses that the pulse response $I'(t)$ of FIG. 2d is derived from the envelope $P(t)$ of FIG. 2e by alternatingly reversing the sign of the envelope $P(t)$ at the end of the successive clock time intervals.

In spite of the large differences or contributions in the pulse response of FIG. 2d the entirely new concept of the apparatus according to the invention provides a pulse response of excellent shape at a minimum clock frequency, since according to the preceding discussion the envelope P(t) of FIG. 2e is closely approximated to.

The apparatus according to the invention while having a particularly simple structure ensures a transfer characteristic H(ω) of high quality at a minimum clock frequency and hence with maximum available internal processing time, so that its field of use is considerably extended, permitting for example a considerable increase of the set of transfer characteristics which are obtainable in practice, especially towards higher frequency ranges, such as for band-pass filters, high-pass filters, phase shifters and the like.

On the other hand, the apparatus according to the invention is distinguished by its flexibility in that 23 different transfer characteristics are obtained by merely exchanging the multiplication program and also in the complete freedom with regard to the type of analog-to-digital converter used, enabling for example the pulse group encoder shown in FIG. 1 to be replaced by a delta modulator.

Figure 3:
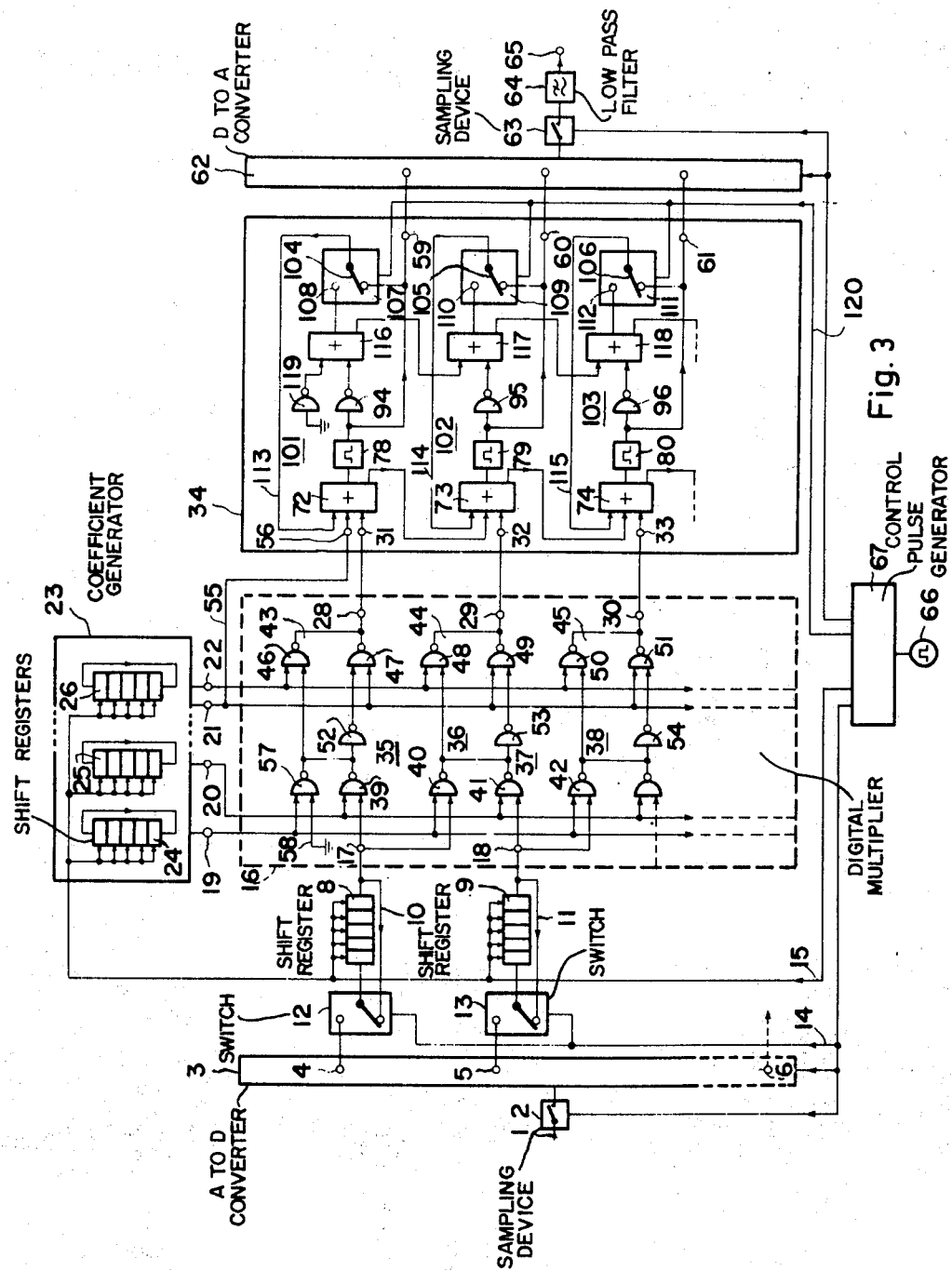
FIGS. 3, 4, 5 and 6 show modified embodiments of the apparatus according to the invention as shown in FIG. 1, and FIGS. 7, 8, 9 and 10 show further embodiments of the apparatus according to the invention.

FIG. 3 shows a modified embodiment of the apparatus of FIG. 1, elements corresponding to those of FIG. 1 being designated by like reference numerals.

Similarly to the apparatus of FIG. 1 the storage device is of the parallel type comprising parallel channels 101, 102, 103, . . ., however, in this embodiment the storage device 34 comprises the combination of an integrator and an alternator, the storage device 34 being connected in each clock period as an integrator and as an alternator by means of electronic switches 104, 105, 106 which each have two change-over contacts 107, 108; 109, 110; 111, 112 respectively; if the switches 104, 105, 106 are connected to the change-over contacts 107, 109, 111 respectively, in the parallel channels 101, 102, 103 respectively summation stages 72, 73, 74, bistable trigger circuits 78, 79, 80, change-over contacts 107, 109, 111 and feedback loops 113, 114, 115 to the inputs of the summation stages 72, 73, 74 respectively together constitute the integrator. If, however, the switches 104, 105, 106 are connected to the change-over contacts 108, 110, 112 respectively, in the parallel channels 101, 102, 103 respectively summation stages 72, 73, 74 bistable trigger circuits 78, 79, 80, inverters 94, 95, 96 in the form of NOT-AND gates, summation stages 116, 117, 118 change-over contacts 108, 110, 112 and switches 104, 105, 106 fed back to an input of the summation stages 72, 73, 74 via feedback loops 113, 114, 115 respectively together constitute the alternator, in which case to an input terminal of the summation stage 116 connected to the inverter stage 94 in the first channel 101 there are also applied "1" pulses from a NOT-AND gate 119 connected to a suitable potential so as to provide digital sign reversal in a binary number system. In this alternator the sign reversing device comprises the NOT-AND gates 119, 94, 95, 96 and the summation stages 116, 117, 118 which each have an input connected to an output of the preceding summation stage 116, 117, . . . for the carry pulses produced in the digital summation.

Via output terminals 59, 60, 61 connected to the bistable trigger circuits 78, 79, 80 respectively the output signal of the storage device 34 including the alternator is applied for further processing to the digital-to-analog converter 62 which in each clock period is rendered operative by pulses from the central control pulse generator 67, similarly to what is the case in the apparatus of FIG. 1.

In the apparatus described, in each clock period the electronic switches 104, 105, 106 are controlled by control pulses from a line 120 connected to the central control pulse generator 67, and under the control of the electronic switches 104, 105, 106 by the integrating operation during the time in which the switches 104, 105, 106 are connected to the change-over contacts 107, 109, 111 respectively, similarly to the apparatus according to FIG. 1, the digital sum of the multiplication products is supplied as the output signal of the storage device 34, whereupon the alternating summation with the digital sums of the multiplication products produced in the preceding clock periods is effected by changing over the electronic switches 104, 105, 106 to the positions in which they are connected to the change-over contacts 108, 110, 112 respectively.

In a manner identical with that used in the apparatus of FIG. 1 the input signal which has been filtered according to the desired filter function is derived as the output signal from the output terminal 65 of the apparatus, the further operation of which has already been described with reference to the diagrams of FIG. 2d and FIG. 2e.

Figure 4:
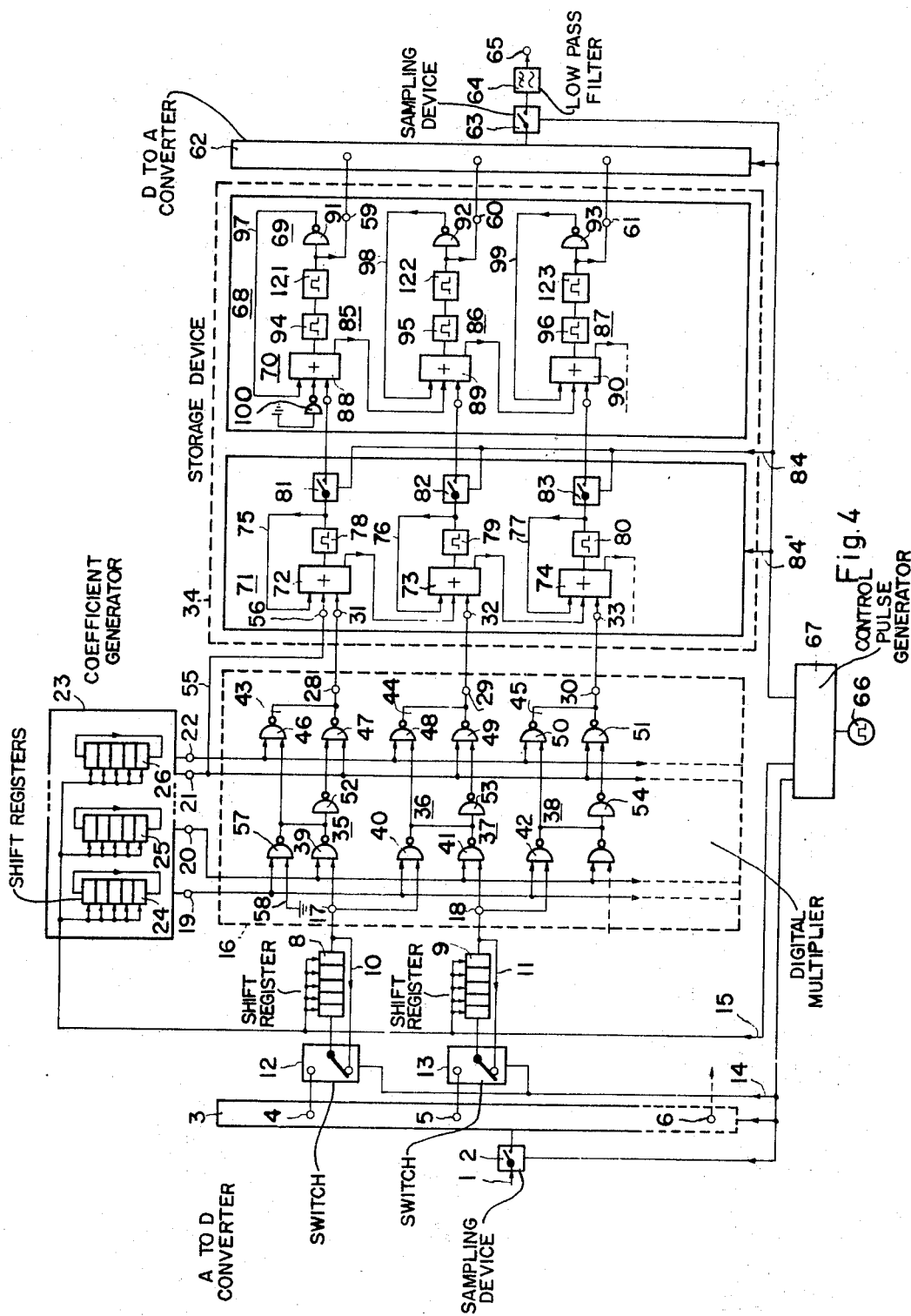

FIG. 4 shows another modified embodiment of the apparatus of FIG. 1, in which again elements corresponding to FIG. 1 are designated by the same reference numerals.

While in the storage device 34 shown in FIG. 1 in each clock period the digital sum of the multiplication products of the digital multiplier 16 which are produced in this period is generated in the accumulator 71, after which in the alternator 68 summation with alternating sign is performed in accordance with the clock period as the prescribed time pattern, in the apparatus of FIG. 4 the summation with alternating sign is effected in accordance with the double clock period, that is at one half of the clock frequency. Thus at intervals of two clock periods the summation of alternating sign is performed in the manner illustrated by a pulse response characteristic I''(t) of FIG. 2f.

This is simply effected by including a second bistable trigger circuit 121, 122, 123 as a delay element in each of the parallel-connected alternator channels 85, 86, 87 respectively of FIG. 1, so that the overall delay in each of the alternator channels is equal to 2 clock periods, providing the apparatus shown in FIG. 4. This step can be used to particular advantage to implement filters in which the center frequency of the pass band lies at about one quarter of the clock frequency, as is illustrated in a transfer characteristic H''(ω) which is shown in FIG. 2g and is associated with the aforementioned pulse response characteristic. Here also the amplitude-frequency characteristic and the phase-frequency characteristic of the filter are shown which now are designated by A''(ω) and B''(ω) respectively.

In a manner identical with that described with reference to FIGS. 2d and 2e in this apparatus the pulse response I''(t) is built up from the envelope which, however, here is composed of two components, i.e. the pulse response component at each even-numbered clock instant and the component at each odd-numbered clock instant, which are illustrated in FIG. 2h by curves P''$_1$(t) and P''$_2$(t) respectively. Similarly the envelope P(t) of FIG. 2e the two components P''$_1$(t) and P''$_2$(t) owing to their shapes are paricularly suitable to be differentially reproduced at a minimum clock frequency, which yields the important advantages mentioned with reference to FIG. 1 hereinbefore.

For completeness it should be mentioned that other time patterns may also be used for the alternating summation in the alternator, for example in accordance with 3 times the clock period by including a third bistable trigger circuit as a delay element in the alternator 68, which is of advantage to obtain filter characteristics having a center frequency of about one sixth the clock frequency, and so on.

Depending upon the position of the pass-band of the filter relative to the clock frequency a suitable choice of the time pattern of the alternating summation will thus enable the pulse response and hence the transfer characteristic to be built up in the most advantageous manner.

Figure 5:
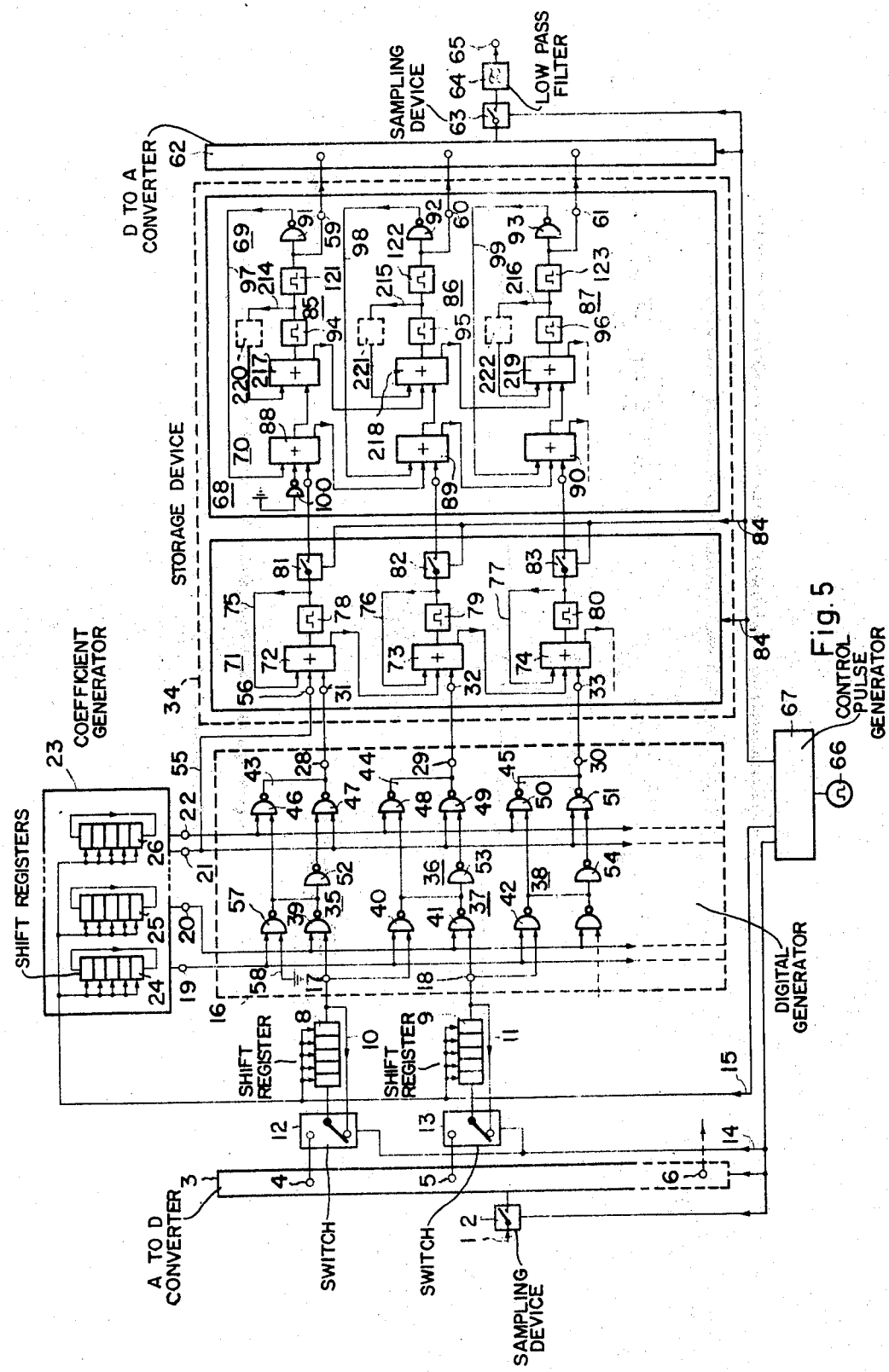

FIG. 5 shows an apparatus of the type shown in FIG. 4 in which the additional step shown in the Figure can be used to advantage as and if required.

As the Figure shows, the step consists of including an additional feedback loop 214, 215, 216, which is connected to a point of the delay circuit constituted by the bistable trigger circuit 94, 121; 95, 122; 96, 123 in the parallel connected alternator channels 85, 86, 87 respectively, and the output signal from this additional feedback loop 214, 215, 216 is added to the alternating sum produced in the alternator 68 by means of summation stages 217, 218, 219 which in the embodiment shown are connected to the output of the summation stages 88, 89, 90 respectively, or the carry pulses of these summation stages 217, 218, 219 an output of each stage is connected to an input of a summation stage 218, 219, ... respectively in a succeeding alternator channel 86, 87,... .

Advantageously this additional feedback loop 214, 215, 216 included in the parallel-connected alternator channel 85, 86, 87 respectively is connected either directly or via a sign reversing stage 220, 221, 222 shown by broken lines, to an input of the summation stage 217, 218, 219 respectively, and in particular it was found that undesirable pass ranges are avoided by this step.

Figure 6:
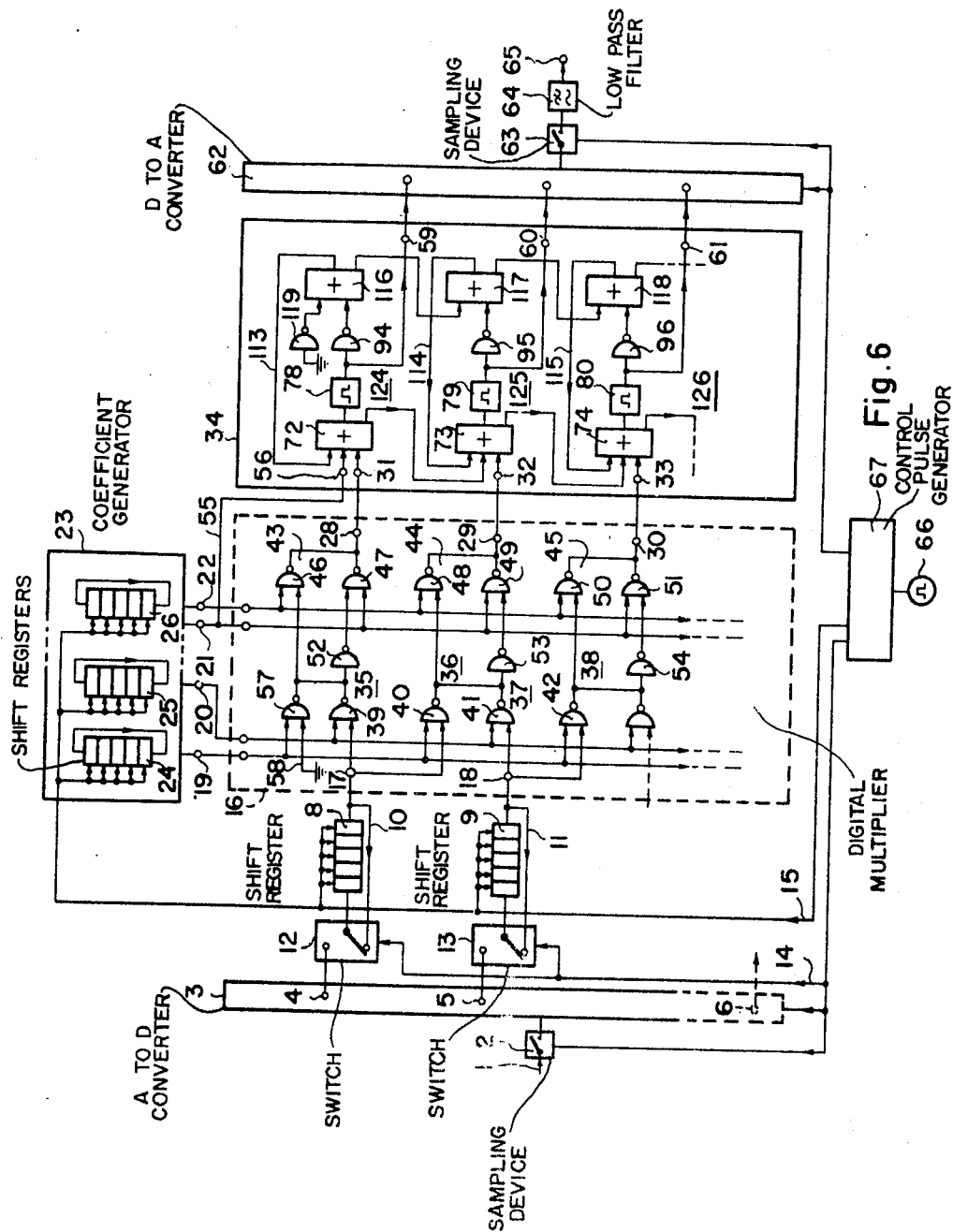

FIG. 6 also shows a modified embodiment of the apparatus of FIG. 1 in which, however, summation alternating in sign is performed in the storage device 34 including the alternator, without using an accumulator or integrator, in the period of the multiplication products formed in the digital multiplier 16 as the prescribed time pattern, i.e. in accordance with the pereiod of the control generator in the form of the shift-pulse generator of duration T/n. Thus the apparatus shown provides a considerable simplification. because a separate accumulator or integrator is dispensed with.

In the embodiment shown the storage device 34 including an alternator corresponds to the alternator which in FIG. 3 is formed when the electronic switches 104, 105, 106 are set to the positions in which they are connected to the change-over contacts 108, 110, 112 respectively. In particular, the storage device 34 of the parallel type constituted by the alternator comprises a plurality of parallel-connected channels 124, 125, 126, while summation stages 72, 73, 74, bistable trigger circuits 78, 79, 80, inverters 94, 95, 96 in the form of NOT-AND gates, summation stages 116, 117, 118 fed back to inputs of the summation stages 72, 73, 74 via feedback loops 113, 114, 115 respectively together constitute the alternator and, similarly to the apparatus shown in FIG. 3, there are applied to the summation stage 116 in the first channel 124 "1" pulses from a NOT-AND gate 119 connected to a suitable potential in order to obtain the digital sign reversal in a binary number system. Parallel input terminals 31, 32, 33 of the storage device 34 which acts as an alternator are directly connected to the parallel output terminals 28, 29 and 30 respectively of the digital multiplier 16, while for sign reversal plurality pulses from the output terminal 21 of the pulse switch program 23 are applied to the input terminal 56 of the summation device 72 in the first channel 124 via the line 55.

Via the output terminals 59, 60, 61 connected to the bistable trigger circuits 78, 79, 80 respectively the storage device 34 which acts exclusively as an alternator is connected for digital-to-analog conversion to the digital-to-analog converter 62 which, similarly to what is the case in the above-described apparatus, is rendered operative in accordance with the clock period T by pulses from the control pulse generator 67.

As was mentioned hereinbefore, alternating summation in accordance with the period of the control generator having a duration T/n is effected in the device 34. More particularly, in the alternator 34 the digital output signal from the summation device comprising the summation stages 72, 73, 74, after being delayed in the delay device comprising the bistable trigger circuits 78, 79, 80 and after being reversed in sign in the sign reversing device comprising the NOT-AND gates 119, 94, 95, 96 and summation stages 116, 117, 118 respectively, is fed back via feedback loops 113, 114, 115 to the summation device 72, 73, 74 for addition to the next subsequent multiplication product of the digital multiplier 16, whereupon the resulting output signal from the summation device 72, 73, 74 after being delayed again by T/n and after having its sign reversed again, is fed back to the input of the summation device 72, 73, 74 via feedback loops 113, 114, 115 to be added to the instantaneous multiplication product.

The cycle described repeats and, as was described hereinbefore, at the output terminal 59, 60, 61 of the alternator 34 the same output signal is obtained as in the apparatus of FIGS. 1 and 3, provided that care is taken to ensure that during each clock period T determined by the pulse switch setting program 23 an odd number of multiplication coefficients occur which in absolute value form a differential code.

In a manner which completely corresponds to that which was described hereinbefore with reference to the diagrams of FIGS. 2e and 2d, the pulse response characteristic $I'(t)$ of FIG. 2d is obtained to achieve the transfer characteristic $H'(\omega)$ of FIG. 2d.

If the number of multiplication coefficients is even, additional steps are required. For example, the number of multiplication coefficients per clock period may be made odd, which may be performed in a particularly simple manner in that one multiplication coefficient of value zero, or in general an odd number of such multiplication coefficients, is added to the beginning or to the end of the series of multiplication coefficients. The same results may be attained in another manner in that a sign reversing device is included after the circulating shift registers and another sign reversing device is included after the storage device 34 constituted by the alternator, which sign reversing devices effect sign reversal under control of an electronic switch in accordance with twice the clock period.

Figure 7:
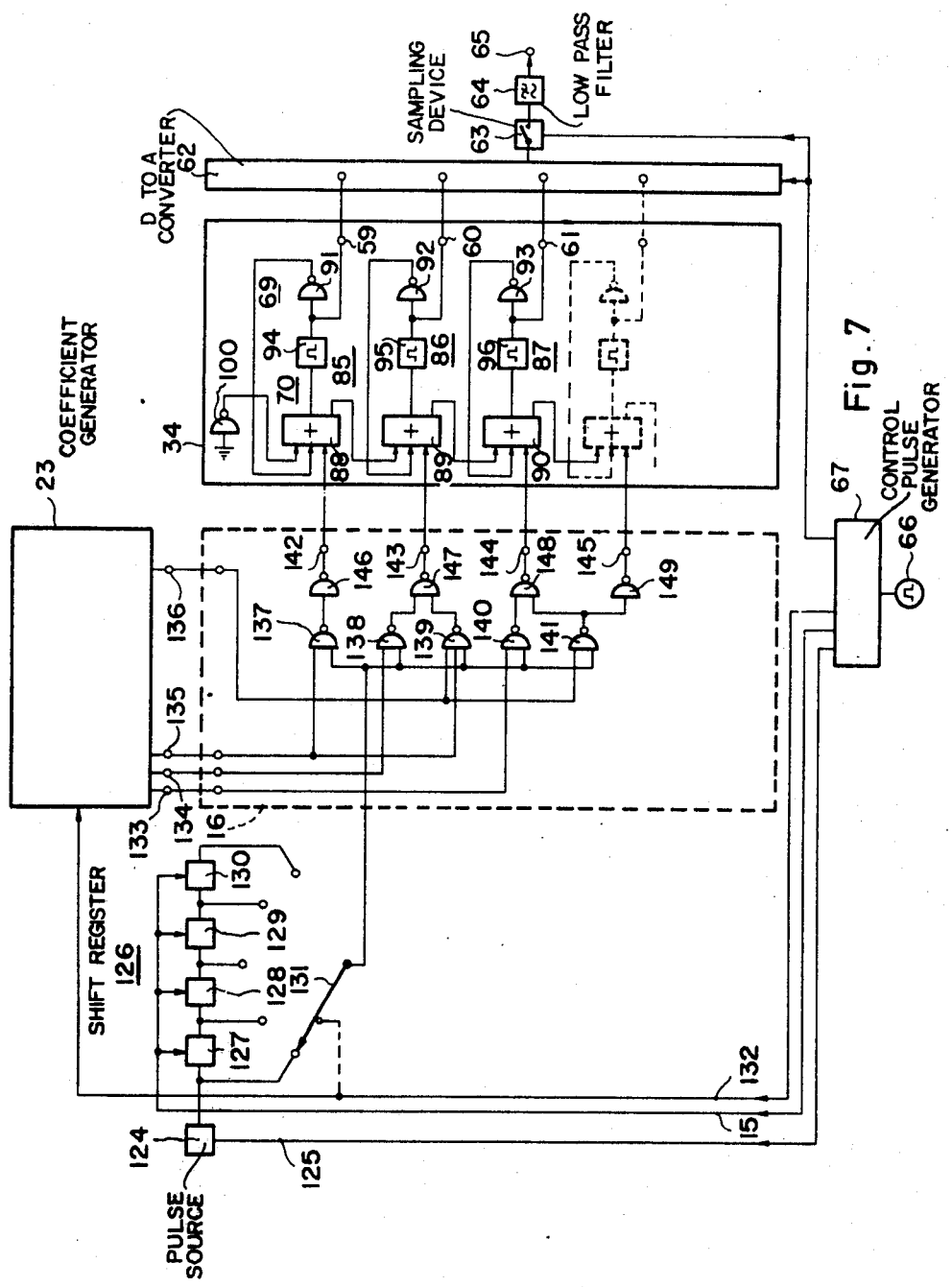

In the apparatus according to the invention shown in FIG. 7 the binary pulse signals, for example synchronous telegraphy signals, delta modulation signals and the like, are taken from a pulse source 124 which through a line 125 is controlled by clock pulses from the central control pulse generator 67. Elements which correspond to those of FIG. 1 are designated by like reference numerals.

For the filtering process the pulse signals from the pulse source 24 are applied in a manner similar to that described with reference to FIG. 1 to a shift register 126 which comprises shift register elements 127, 128, 129, 130 the contents of which are shifted via the line 15 in accordance with the clock frequency or a multiple thereof, while furthermore similarly to the apparatus shown in FIG. 1 care is taken to ensure that for digital multiplication each input pulse to the shift register 126 delivers a train of output pulses in time sequence. Instead of a circulating shift register, in the apparatus shown an electronic switch 131 is used which within each shift period of the shift register 126 scans the terminals on the shift register elements 127 to 130 under the control of switch pulses supplied via a line 132 by the central control pulse generator 67, which switch pulses also form the control pulses of the multiplication program 23.

Similarly to what is the case in FIG. 1, the digital multiplier 16 is in the form of a pulse switch having a plurality of pulse switch channels for digital multiplication of the pulses from the switch 31 by the multiplication coefficients $2^2$, $2^1$, $2^0$, 0, setting to the desired multiplication coefficient being effected by pulse code groups which appear at output terminals 133, 134, 135 of the multiplication program 23 in the form of a pulse switch setting program, while the setting of the sign is effected by sign pulses which appear at an output terminal 136, the digital sign reversal in a binary number system being performed in the digital multiplier 16 constituted by the pulse switch.

In particular the pulse switch 16 comprises parallel NOT-AND gates 137, 138, 139, 140, 141 connected to the electronic switch 131, output terminals 133, 134, 135 of the multiplication program 23 being connected to the NOT-AND gates 140, 138 and 137, 139 respectively, and the sign terminal 136 being connected to the NOT-AND gates 139, 141, while further NOT-AND gates 146–149 are provided which are connected to output terminals 142–145 respectively and the inputs of which are connected to the NOT-AND gate 137, the NOT-AND gates 138, 139, the NOT-AND gates 140, 141 the NOT-AND gate 149, ..., respectively.

Under control of the code groups and the sign pulses at the output terminals 133–136 of the pulse switch setting program 23 digital multiplication according to the desired multiplication coefficient and sign is directly performed in the pulse switch 16 described. In the case of the multiplication coefficient O, for example, the code group 000 will appear at the terminals 133–135 of the pulse switch setting program 23 and the sign pulse at the sign terminal 136 also is equal to O, so that at none of the output terminals 142–145 of the digital multiplier 16 a pulse appears; in the case of the multiplication coefficients $+2^0$, $+2^1$, $+2^2$ the code groups 001, 010 and 100 respectively will appear at the terminals 133–135 of the pulse switch setting program 23 and the sign pulse at the signal terminal 136 is equal to 0, so that only at the output terminals 142, 143, 144 respectively of the multiplier 16 a pulse will appear which corresponds to digital multiplication in a binary number system by $2^0$, $2^1$, $2^2$ respectively; in the cases of the multiplication coefficients $-2^0$, $-2^1$, $-2^2$ the same code groups appear at the terminals 133, 134, 135 of the pulse switch setting program 23, but a sign pulse now does appear at the sign terminal 136, so that at all the output terminals 142–145, at the output terminals 143–145 and at the output terminals 144–145 respectively of the multiplier 16 pulses will appear, which corresponds to digital multiplication in a binary number system by $-2^0$, $-2^1$, $-2^2$ respectively.

Thus at the output terminals 142–145 of the pulse switch 16 digital signals multiplied according to multiplication coefficients and sign are obtained, which multiplication products in the storage device 34, which is in the form of an alternator, are alternatingly summed in accordance with the occurrence of the multiplication products, and like in the apparatus of FIG. 6 the number of multiplication coefficients per clock period is an odd number. The alternator 34 shown corresponds to the alternator described with respect to FIG. 1 and hence need not be explained more fully, corresponding elements being designated by like reference numerals.

For further processing, the alternator 34 is connected to a digital-to-analog converter 62 in the form of a pulse group decoder to the output of which is connected a sampling device 63, the output signal of the apparatus, which is the input signal filtered according to the desired transfer function, being produced via a low-pass filter 64 at the output terminal 65.

In the apparatus according to the invention the complete freedom in the choice of the type of analog-to-digital conversion to be used provides the important advantage that the type of the analog-to-digital converter can be adapted to the nature of the input signal, for example according to whether speech signals, music signals or television signals are to be processed, while digital signals such, for example, as synchronous telegraphy signals can directly be used without analog-to-digital conversion. It is not absolutely necessary to convert the pulse groups at the output of the alternator into an analog signal in a digital-to-analog converter 62, but these pulse groups may be used for further processing, for example for digital modulation.

There also is great freedom in the design of the delay device and, for example, in the delay devices shift registers or random access memories may be used, which for the purpose of obtaining a series of successive output pulses from a single inpput pulse may have different forms, for example may be circulating shift registers, shift registers using electronic switches and the like, as was described hereinbefore with reference to the preceding Figures.

Figure 8:
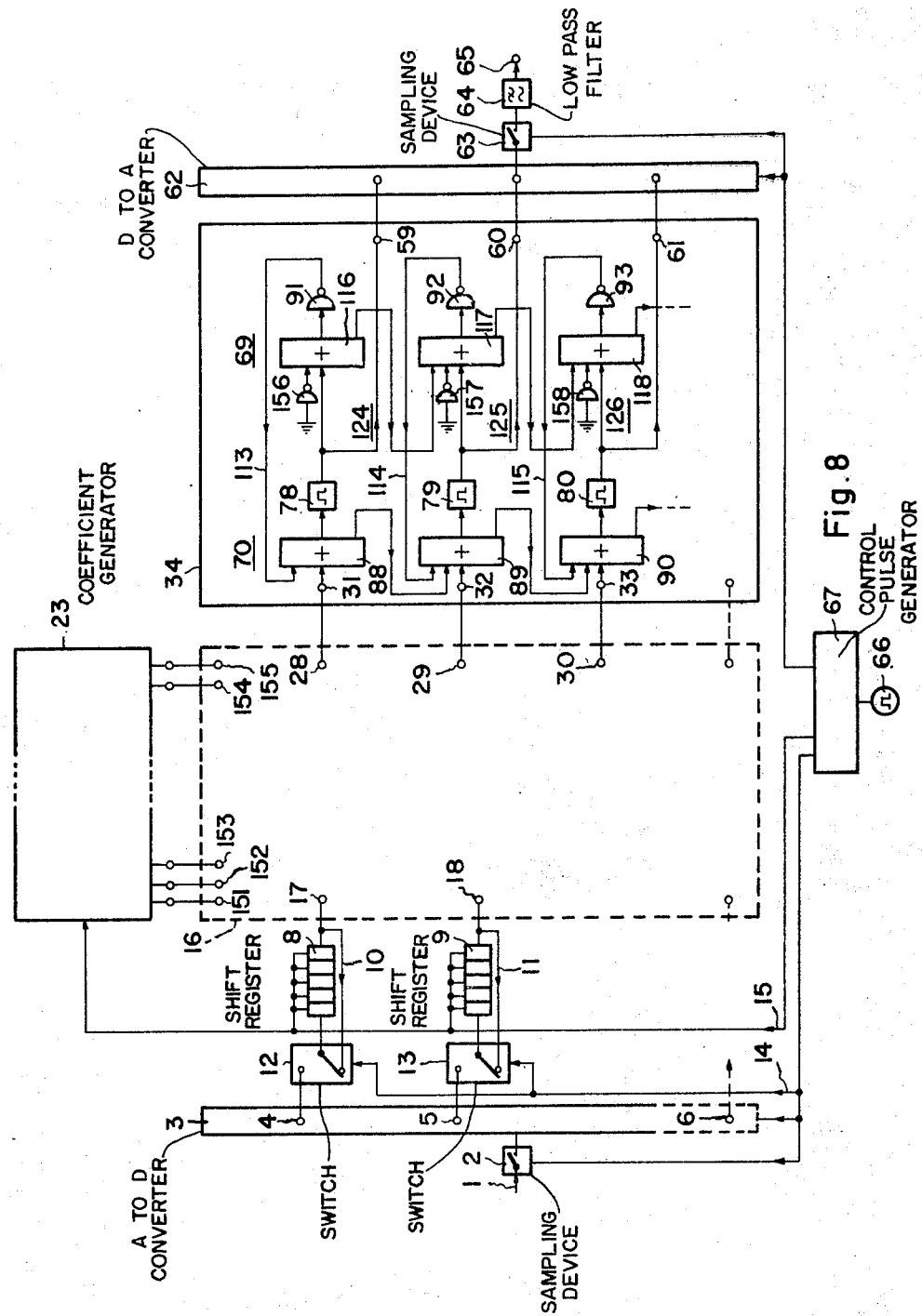

FIG. 8 shows another embodiment of the apparatus according to the invention which differs from the aforedescribed embodiment in that the digital multiplier 16 need not be in the form of a pulse switch but may be of a more usual type. In this case the multiplication program 23 takes the form of a coefficient program the pulse groups derived from its output terminals 151, 152, 153, 154, and 155 defining the multiplication coefficient with regard to sign and magnitude, and similarly to the preceding embodiments the multiplication coefficients characterize, in a differential code, the transfer characteristic to be obtained.

Just as in the embodiment of FIG. 1, in this embodiment circulating shift registers 8, 9 are used and the multiplication products produced in a binary number system by digital multiplication of the pulse groups from the circulating shift registers 8, 9 according to sign and magnitude by the coefficients of the coefficient program 23 appear at the output terminals 28, 29, 30 to be applied to the storage device 34 in the form of an alternator which forms the alternating sum of the applied multiplication products and the preceding multiplication products. Via the digital-to-analog converter 62, the output circuit of which includes the sampling device 63 and the succeeding low-pass filter 64, the output signal of the device appears at the output terminal 65, which signal just like in the preceding apparatus forms the input signal filtered in accordance with the desired transfer function.

In its function the alternator 34 used is equal to the devices described hereinbefore and it similarly comprises a summation device 70 made up of summation stages 88, 89, 90 and a sign reversing device 69 made up of sign reversing stages provided with inverter stages 91 92, 93 in the form of NOT-AND gates for logical inversion of the applied pulse groups and summation stages 116, 117, 118, the summation stages 88, 89, 90 included in the alternator channels 124, 125, 126 being connected through bistable trigger circuits 78, 79, 80 to the inputs of the sign reversing stages 91–93; 116–118, while the outputs of the sign reversing stages are connected through feedback loops 113, 114, 115 to inputs of the summation stages 88, 89, 90 respectively. The input terminals 31, 32, 33 of the summation stages 88, 89, 90 are connected to the output terminals 28, 29, 30 respectively of the digital multiplier, while an inpput terminal of each of the summation stages 89, 90 is connected to an output terminal of the preceding summation stage 88 and 89 and an input terminal of each of the summation stages 117, 118 of the sign reversing stages is connected to an output of the preceding stages 116, 117, rspectively for the carry pulses which are produced in the digital summation.

The digital sign reversing device 69 in the alternator 34 of this embodiment differs from that of the embodiments shown in the preceding Figures in that in the latter digital sign reversal is effected by the addition, after logical inversion, of a pulse group having the value +1, whereas in the apparatus shown in FIG. 8 digital sign reversal is effected in that prior to logical inversion a pulse group having the value −1 is added which in a binary number system is represented by a pulse group 111 ... . This in the apparatus of FIG. 8 "1" pulse from a NOT-AND gate 156, 157, 158 connected to a fixed potential is applied to the summation stages 116, 117, 118 respectively of the sign reversing device 69 while the NOT-AND gates 91, 92, 93 which servee as inverters are connected after the summation stages 116, 117, 118 respectively, and similarly to what has been described hereinbefore the output signal from the sign reversing device 69 is applied to inputs of the summation stages 88, 89, 90 via feedback loops 113, 114, 115 respectively.

The operation of this embodiment of the apparatus is identical with that of the preceding apparatus and in view of the preceding extensive discussion needs no further explanation.

The apparatus described hereinbefore show that the digital multiplier may take different forms, for example that of a pulse switch or a more usual design, and the same applies to the form of the multiplication program, which may be a pulse switch setting program or a coefficient program and may be differently implemented, for example as shift registers, read only memories composed of magnetic cores, transistor arrays and the like. However, the multiplication coefficients used for digital multiplication in the digital multiplier must always characterize the desired transfer characteristic in a differential code.

Figure 9:
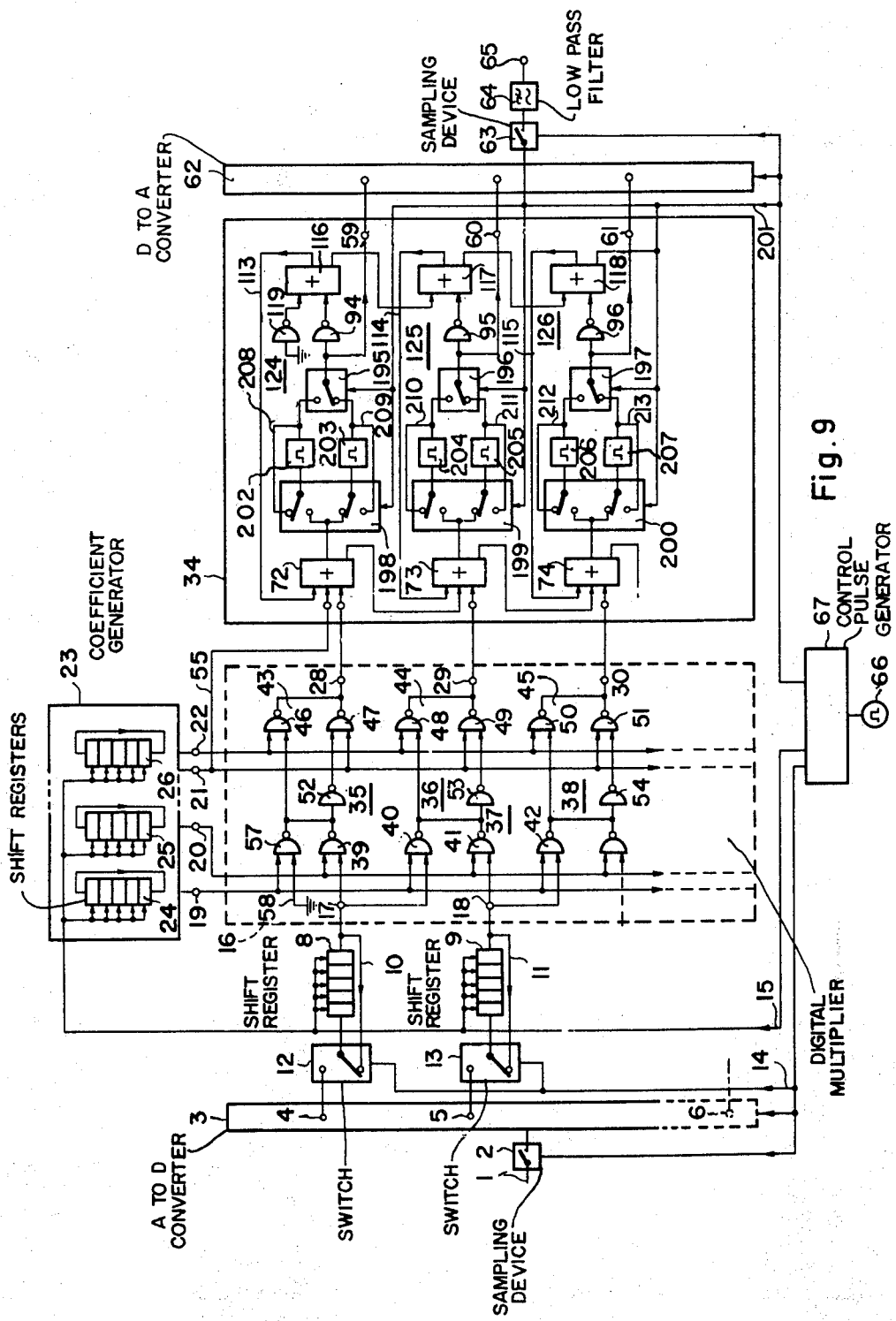

FIG. 9 shows a modified embodiment of the apparatus shown in FIG. 6 which similarly to that shown in FIG. 6 effects summation of alternating sign in the period of the multiplication products formed in the digital multiplier 16. However, the use of a storage network arranged to change over in each clock period provides the pulse response characteristic $I''(t)$ as illustrated in FIG. 2f and obtained by means of the apparatus of FIG. 4, which characteristic corresponds to a center frequency of the transfer characteristic $H''(\omega)$ at one quarter of the clock frequency or thereabout.

Similarly to the embodiment of FIG. 6, the storage device 34 designed as an alternator comprises parallel-connected channels 124, 125, 126 provided with a summation device having summation stages 72, 73, 74 and with a sign reversing device comprising inverters 94, 95, 96 connected to summation stages 116, 117, 118 and a NOT-AND gate 119 which is connected to the summation stage 116 and continuously produces "1" pulses, outputs of the summation stages 116, 117, 118 in the sign reversing stages being connected through feedback loops 113, 114, 115 to the summation stages 72, 73, 74 respectively. Between the summation stages 72, 73, 74 and the inverters 94, 95, 96 in each of the parallel-connected channels 125, 125, 126 respectively there is included a storage network which is capable of being changed over in each clock period and comprises single-pole electronic switches 195, 196, 197 and double-pole electronic switches 198, 199, 200 respectively, which in each clock period are simultaneously changed over via a line 201, and parallel delay elements which are included between the switches and take the form of bistable triggers 202, 203; 204, 205; 206, 207, respectively. Each of the parallel-connected channels 124, 125, 126 includes one of the bistable triggers 202, 203; 204, 205; 206, 207 respectively between the relevant summation stage and sign reversing stage in the same manner as in FIG. 6, while the other bistable trigger is connected as a circulating store by means of a recirculating circuit 208, 209; 210, 211; 212, 213 respectively.

In the positions of the switches 195–197, 198–200 shown in the Figure the alternating summation of the multiplication products is effected via the bistable triggers 203, 205, 207, and at the end of the clock period the switches 195–197, 198–200 are switched to their other positions by means of a switch pulse on the line 201. In the latter positions of the switches the digital sum produces is stored, at the end of the clock period, in the bistable triggers 203, 205, 207 which then are connected as circulating stores, while the alternating summation takes place via the bistable triggers 202, 204, 206, the first value being the digital sum stored in these triggers at the end of the preceding clock period. The cycle described repeats in each clock period in that the switches 195–197, 198–200 are switched by means of a switching pulse on the line 201.

In actual fact the operation described entirely corresponds to the operation of the apparatus of FIG. 4, the pulse response characteristic $I''(t)$ illustrated in FIG. 2f being formed which corresponds to the transfer characteristic at a quarter of the clock frequency or at a frequency very close thereto. Similarly to what is the case in the apparatus of FIG. 6 in each clock period an odd number of multiplication coefficients occur which devine the transfer characteristic to be obtained in absolute value according to a differential code.

In this apparatus also, the location of the pass band of the filter relative to the clock frequency is adjustable, and if, for example, a passband is desired at one sixth of the clock frequency the switches 198–200 take the form of three-pole switches and the single-pole switch has three change-over contacts to each of which a bistable trigger is connected, the summation stage in the relavent alternator channel being connected to the associated sign reversing stage via one of the triggers while the remaining bistable triggers are switched as circulating stores.

Figure 10:
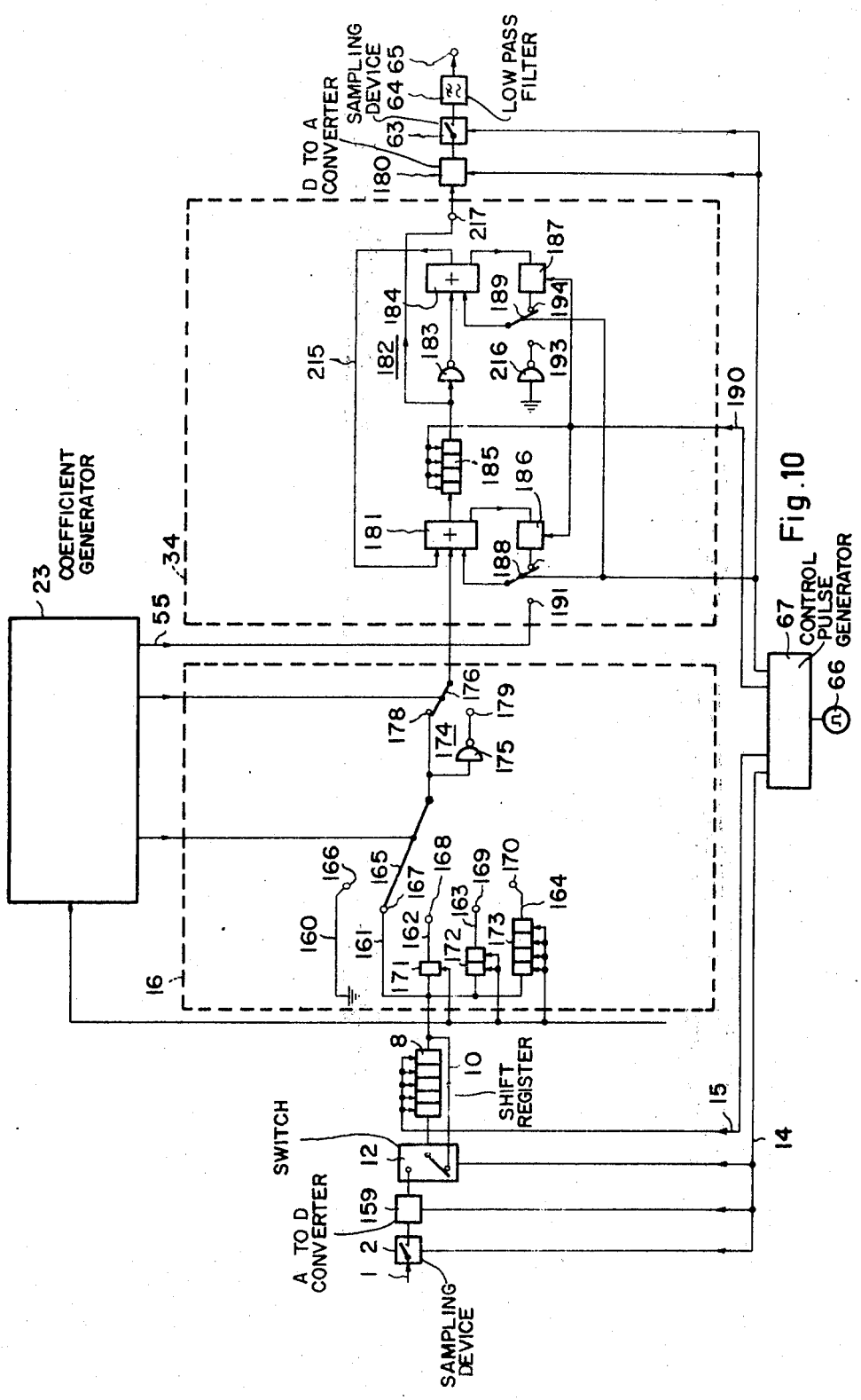

Whereas in the preceding embodiments alternators of the parallel type are used, FIG. 10 shows an apparatus in which an alternator 34 of the series type is used.

In the apparatus shown in FIG. 10 analog signals coming in via a line 1 are applied to a sampling device 2 controlled by sampling pulses at clock frequency, the samples being applied to an analog-to-digital converter 159 which is in the form of a pulse group encoder having a series output. Thus at the output of the pulse group encoder 159 pulse groups are obtained which are constituted by constituent pulses which succeed one another in time, corresponding constituent pulses of successive pulse groups occurring in accordance with the block frequency, while the constituent pulses which succeed one another in time in a pulse group characterize successive numbers in a binary number system, and in this embodiment the first constituent pulse corresponds to the number $2^0$, the second to the number $2^1$, and so on. The time interval between two successive pulse groups is equal to 4 times the interval $\tau$ between two successive pulses in a group.

For digital filtering the pulse groups generated in the pulse group encoder 159 are applied to a circulating shift register 8 provided with a recirculating circuit 10 and an electronic switch 12 for generating a series of successive pulse groups as a result of each pulse group applied to the input circuit of the shift register 8, which successive pulse groups are applied to a digital multiplier in the form of a pulse switch 16 which comprises a plurality of parallel-connected pulse switch channels 160, 161, 162, 163, 164 and a pulse switch setting circuit 23 which includes a switch 165 which is controlled by a setting code of the pulse switch setting program and has change-over contacts 166–170 provided on the pulse switch channels 160–164 respectively. More particularly, the pulse switch channel 160 is at a fixed potential which corresponds to "0" pulses, corresponding to a multiplication coefficient 0, the remaining pulse switch channels 161–164 being connected to the output of the circulating shift register 8, the channel 161 directly and the other channels via delay elements 171, 172, 173 respectively in the form of shift registers having delay times equal to once, twice and four times the space $\tau$ of two successive constituent pulses in a pulse group, corresponding to multiplication coefficients $2^0$, $2^1$, $2^2$ and $2^4$ respectively, because a time delay of $m\tau$ effects digital multiplication by a multiplication coefficient $2^m$.

For sign setting the electronic switch 165 is connected to a sign stage 174 comprising two parallel branches one of which includes a NOT-AND gate 175 acting as an inverter, and a sign setting circuit comprising an electronic switch 176 which is controlled by sign pulses from the pulse switch setting program 23 and has change-over terminals 178 and 179 each connected to one of the parallel branches. To each of the pulse groups logically inverted in the sign stage 174 a pulse corresponding to the value $2^0$ is added to obtain a pulse group of opposite sign in a binary number system, which pulse similarly to FIG. 1 is in the form of a sign pulse derived via the line 55 from the pulse switch setting program 23.

When in the apparatus described so far the two electronic switches 165 and 176 in the digital multiplier 16 are set to the desired positions by the setting code of the pulse switch setting program 23, the pulse groups from the circulating shift register 8 are digitally multiplied by the multiplication coefficients in differential code which appertain to the positions of the two electronic switches 165 and 176 and the multiplication products which as a result are produced at the output terminal of the digital multiplier 16 are applied for further processing to the alternator in the storage device 34, which alternator will be described hereinafter. Via a digital-to-analog converter 180 the output circuit of which includes a sampling device 63 and a succeeding simple low-pass filter 64 the output signal of the apparatus described can be derived from the output terminal 65.

In order to obtain the alternating sum in accordance with the pulse groups applied which are constituted by the constituent pulses which occur in time sequence and the preceding pulse groups the alternator 34 used is of the series type. Similarly to the alternators described with reference to the preceding Figures, the alternator 34 comprises a summation device 181 and a sign reversing device 182, which latter device is constituted by a NOT-AND gate 183 which serves as an inverter and by a summation device 184, an output of the sign reversing device 182 being connected via a feedback loop 215 to an input of the summation device 181 while an output of this summation device 181 is connected, via a delay element 185 in the form of a shift register, to an output of the sign reversing device 182, the output signal of the alternator 34 being derived from the output of the shift register 185.

Outputs of the summation devices 181, 184 are connected by carry lines for carry pulses via delay elements in the form of shift registers 186, 187 and electronic switches 188, 189 having change-over terminals 191, 192; 193, 194 respectively to inputs of the relevant summation devices 181, 184 respectively. The delay time of the shift register 185 is made equal to the time period of two successive pulse groups which in the embodiment shown is equal to the clock period T, while the delay time of the shift registers 186, 187 is made equal to the time spacing $\tau$ of two successive constituent pulses in a pulse group.

Under the control of which pulses applied by the central control pulse generator 67 via a line 190, at the beginning of each pulse group the change-over terminals 191, 193 are connected by the electronic switches 188, 189 to the summation devices 181, 184 respectively so that the instantaneous sign pulses of the pulse switch setting program 23 are applied via the line 55 to the summation device 181 and pulses from a NOT-AND gate 216 connected to a fixed potential are applied to the input of the summation device 184. AFter the first constituent pulse of the pulse group the electronic switches 188, 189 are switched to the change-over terminals 192, 194 respectively and the carry pulses formed in the summation devices 181, 184 are applied via the carry lines to the inputs of the summation devices 181, 184 respectively, so that by means of the digital summation device 181 and the digital sign reversing device 182 in the alternator the alternating sum is formed which is derived from an output terminal 217 for further processing.

In a manner identical to that described with reference to the time diagrams of FIG. 2d and FIG. 2e, suitable setting for the multiplication coefficients enables the pulse response I'(t) to be built up which determines the desired transfer characteristic H'(ω).

Hereinbefore the apparatus according to the invention was described with reference to various embodiments, and it was shown that the alternator may be of various types, for example of series and parallel types, which moreover each may be differently designed, however, there are further possibilities, for example constructing the alternator according to analog techniques, inter alia for use in a sequence exchange of storage device and digital-to-analog converter, at least partial combination of elements of the summation device and the sign reversing stage or possibly the digital multiplier, and the like.

What is claimed is:

1. An apparatus for producing a predetermined transfer characteristic of information-containing signals, comprising clock means for generating clock pulses, input means for supplying said information-containing signals; coefficient generator means for supplying a first train of pulses of digital multiplication coefficients; delay means, connected to said input means, for supplying a second train of pulses of representations of said information-containing signals in successive time periods digital multiplier means; having a first input connected to said coefficient generator, a second input connected to said delay means and an output for digitally multiplying pulses from each of said respective pulse trains to produce an output pulse train on said output; and storage means connected to said output of said multiplier means, and comprising an alternator for performing a predetermined arithmetic operation on said output pulse train.

2. Apparatus as defined in claim 1, wherein said alternator comprises a sign reversing device and a summation device for performing the operations of sign reversing and summation on at least some of said pulses from said output pulse train.

3. Apparatus as defined in claim 2 wherein, said alternator comprises means for applying alternating polarity to multiplication products represented by said output pulse train over a predetermined time period.

4. Apparatus as defined in claim 1, wherein said alternator comprises an output, a further comprising output means connected to said output of said alternator for producing an output signal having said predetermined transfer characteristic.

5. Apparatus as defined in claim 2, wherein the input of the sign reversing device is connected to the output of said summation device which is supplied by the sign reversing device via a feedback loop and also is fed with multiplication products of the multiplier which lie within given time periods.

6. Apparatus as defined in claim 2, wherein the alternator includes a circuit comprising at least one delay element for delaying the alternating sum formed in the alternator by a time interval equal to an integral multiple of the predetermined time periods in which the multiplication products of the multiplier lie.

7. Apparatus as defined in claim 6, wherein said delay element is connected in cascade with said summation device and said sign reversing device comprises a bistable trigger circuit.

8. Apparatus as claimed in claim 6, wherein said delay element is connected in cascade with said summation device and said sign reversing device comprises a shift register controlled by shift pulses.

9. Apparatus as defined in claim 6, wherein the delay of said delay means is equal to a multiple of the time period in which the multiplication products lie, wherein said delay means comprises a delay circuit provided with an additional feedback loop, the output signal of said additional feedback loop being added to the alternating sum formed in said alternator.

10. Apparatus as defined in claim 9, wherein the signal derived from said delay circuit is directly added via said additional feedback loop to the alternating sum formed in said alternator.

11. Apparatus as defined in claim 9, wherein the signal derived from the delay circuit is added after sign reversal in a sign reversing device, by means of said additional feedback loop to the alternating sum formed in said alternator.

12. Apparatus as defined in claim 2, wherein said sign reversing device comprises an inverter connected to the output of said summation device and is connected to an input of said summation device via said feedback loop; and a source for continuously generating "1" pulses for said digital sign reversal device, said source also being connected to an input of said summation device.

13. Apparatus as defined in claim 2, wherein said sign reversing device comprises a summation device having a first input which is coupled to an output of said summation device of said alternator, and, a second input, and a source connected to said second input for continuously generating "1" pulses.

14. Apparatus as defined in claim 3 further comprising an accumulator connected to the multiplier for summing the applied multiplication products in accordance with said time periods, at the beginning of each of these time periods the accumulator is reset to the inoperative condition by switching pulses and simultaneously the digital sum formed in the accumulator is applied to the alternator.

15. Apparatus as defined in claim 3 wherein said alternator further comprises an integrator, an electronic switch for changing connections from said integrator and to said alternator, said electronic switch being under control of switch pulses which occur in accordance with said given time pereiod, for applying the digital sum formed in this time period to the device which then is connected as an alternator.

16. Apparatus as defined in claim 14, wherein said switching pulses occur in accordance with the clock period.

17. Apparatus as defined in claim 9 wherein the output of said digital multiplier is directly connected to said alternator for performing the alternating summation corresponding to the product of the applied multiplication products from said multiplier.

18. Apparatus as defined in claim 17, wherein during each clock period an odd number of multiplication coefficients occur which represent a differential code.

19. Apparatus as defined in claim 17, wherein during each clock period an even number of multiplication coefficients occur, and an odd number of multiplication coefficients equal to zero is added serially to the series of multiplication coefficients.

20. Apparatus as defined in claim 17, wherein during each clock period an even number of multiplication coefficients occur, further comprising a first sign reversing device preceding the delay device and connected to the digital multiplier, and a second sign reversing device succeeding said alternator, said reversing devices performing sign reversal in accordance with the double clock period.

21. Apparatus as defined in claim 17, wherein said alternator comprises a storage netwoek capable of being changed over in each period, provided with at least two parallel-connected circuits each including a delay element, one of said circuits forming said delay circuit of said alternator wherein the remaining circuit acts as a storage network for the digital sums formed in the preceding time period.

22. Apparatus as defined in claim 2, wherein the output of said alternator is connected to the output of said summation device.

23. Apparatus as defined in claim 2, wherein the output signal of said alternator is activated in accordance with the clock period.

24. Apparatus as defined in claim 2 wherein said alternator is of parallel type and wherein the summation device comprises a plurality of summation stages which are connected to one of a plurality of parallel-connected alternator channels, each of said channels including a sign reversing stage, said reversing stages together constituting said sign reversing device, and further comprising an input of said summation stages in said alternator channel connecting an output of the corresponding summation stages in a preceding alternator channel by means of a carry line for the ;carry pulses produced in the summation operation.

25. Apparatus as defined in claim 2, wherein said alternator is of series type, said summation device and said sign reversing device being included in a series channel, an output and an input of the summation stages included in said alternator channel being connected via a carry line for carrying pulses produced in the summation operation to a delay element included in said carry line and having a delay time equal to the time spacing between two successive constituent pulses in a pulse group.

26. Apparatus as defined in claim 25, wherein said carry line extends between the input and the output of said summation device, and further comprising an electronic switch having a first and a second change-over terminal, one of said terminals being connected to a source for generating the digitally sign-reversed signal while the other of said terminals is connected to the output of the summation device, wherein under the control of periodic switching pulses the electronic switch at the beginning of each pulse group is connected to the first terminal and after the first constituent pulse of the pulse group is changed over to the second terminal.

27. Apparatus as defined in claim 2, wherein said digital multiplier comprises a pulse switch having a plurality of pulse switch positions, and a pulse switch setting circuit, said setting circuit being under the control of a setting code from a multiplication program formed by a pulse switch setting program for setting the pulse switch in a predetermined one of said various pulse switch positions corresponding to a digital multiplication performed by one of a plurality of multiplication coefficients which exclusively form part of the discrete number set $2^m$, where $m = 0, 1, 2, 3, ...,$ and possibly the number 0.

* * * * *

UNITED STATES PATENT AND TRADEMARK OFFICE
CERTIFICATE OF CORRECTION

PATENT NO. : 3,978,323　　　　　　　　　　　Page 1 of 2
DATED : August 31, 1976
INVENTOR(S) : WOLFGANG FRIEDRICH GEORG MECKLENBRAUKER ET AL It is certified that error appears in the above-identified patent and that said Letters Patent are hereby corrected as shown below:

Column 5, line 61, "$\gamma T \pm (n-q)T/n$" should be
　　　　　　　　　　--$\gamma T + (n-q)T/n$--
　　　　　line 66, delete "1" (second occurrence)

Column 10, line 62, "." should be --,--

Column 13, line 50, "pereiod" should be --period--
　　　　　line 52, "." should be --,--

Column 15, line 66, "signal" should be --sign--

Column 17, line 37, "rspectively" should be --respectively--
　　　　　line 48, after "8" insert --a--
　　　　　line 52, "servee" should be --serve--

Column 18, line 55, "produces" should be --produced--

Column 19, line 4, "vine" should be --fine--
　　　　　line 30, "block" should be --clock--

Column 20, line 42, "output" should be --input--
　　　　　line 57, "which" should be --switch--

UNITED STATES PATENT AND TRADEMARK OFFICE
CERTIFICATE OF CORRECTION

PATENT NO. : 3,978,323
DATED : August 31, 1976
INVENTOR(S) : WOLFGANG FRIEDRICH GEORG MECKLENBRAUKER ET AL It is certified that error appears in the above-identified patent and that said Letters Patent are hereby corrected as shown below:

line 12, "output" should be --output,--

Claim 3, line 1, "2 wherein," should be --2, wherein--

Claim 4, line 2, "a" should be --and--

Claim 15, line 2, after "integrator," insert --and--
            line 4, after "grator" delete "and"

Claim 21, line 2, "netwoek" should be --network--

Claim 23, line 1, "2" should be --22--

Claim 25, line 7, delete "."

Signed and Sealed this

Sixteenth Day of May 1978

[SEAL]

Attest:

RUTH C. MASON
Attesting Officer

LUTRELLE F. PARKER
Acting Commissioner of Patents and Trademarks